United States Patent
Oda et al.

(10) Patent No.: US 11,958,971 B2
(45) Date of Patent: Apr. 16, 2024

(54) PHOTOCURABLE COMPOSITION, METHOD FOR PRODUCING CONCAVE-CONVEX STRUCTURE, METHOD FOR FORMING FINE CONCAVE-CONVEX PATTERN, AND CONCAVE-CONVEX STRUCTURE

(71) Applicant: MITSUI CHEMICALS, INC., Tokyo (JP)

(72) Inventors: Takashi Oda, Ichihara (JP); Hisanori Ohkita, Chiba (JP); Hiroko Wachi, Chiba (JP); Shingo Yamamoto, Chiba (JP)

(73) Assignee: MITSUI CHEMICALS, INC., Tokyo (JP)

( * ) Notice: Subject to any disclaimer, the term of this patent is extended or adjusted under 35 U.S.C. 154(b) by 345 days.

(21) Appl. No.: 17/433,710

(22) PCT Filed: Mar. 31, 2020

(86) PCT No.: PCT/JP2020/014775
§ 371 (c)(1),
(2) Date: Aug. 25, 2021

(87) PCT Pub. No.: WO2021/009980
PCT Pub. Date: Jan. 21, 2021

(65) Prior Publication Data
US 2022/0135787 A1    May 5, 2022

(30) Foreign Application Priority Data
Jul. 12, 2019   (JP) .................... 2019-129863

(51) Int. Cl.
*B29C 59/02*    (2006.01)
*C08L 63/00*    (2006.01)
(Continued)

(52) U.S. Cl.
CPC ............ *C08L 63/00* (2013.01); *B29C 59/022* (2013.01); *G03F 7/0002* (2013.01);
(Continued)

(58) Field of Classification Search
CPC ...... G03F 7/0002; G03F 7/038; G03F 7/0755; H01L 21/0271; C08L 63/00; C08G 59/68;
(Continued)

(56) References Cited

U.S. PATENT DOCUMENTS 6,322,892 B1   11/2001  Takami
2013/0136818 A1   5/2013  Uehara et al.

FOREIGN PATENT DOCUMENTS

| JP | 2010-067935 A | 3/2010 |
| JP | 2018141028 A | 9/2018 |
| WO | 2012018043 A1 | 2/2012 |

*Primary Examiner* — Monica A Huson
(74) *Attorney, Agent, or Firm* — BUCHANAN, INGERSOLL & ROONEY PC

(57) ABSTRACT

Provided is a photocurable composition used for forming a resin layer of a concave-convex structure including a substrate and a resin layer provided on the substrate and having fine concavities and convexities formed on a surface thereof. A cured film of the photocurable composition has a surface free energy of 15 mJ/m$^2$ to 40 mJ/m$^2$ as measured based on the Kitazaki-Hata theory and a hardness of 0.05 GPa to 0.5 GPa as measured using a nanoindenter.

12 Claims, 1 Drawing Sheet

(51) Int. Cl.
    *G03F 7/00*           (2006.01)
    *H01L 21/027*       (2006.01)
    *B29K 63/00*         (2006.01)
    *B29K 71/00*         (2006.01)
    *B29K 105/00*       (2006.01)

(52) U.S. Cl.
    CPC ...... *H01L 21/0271* (2013.01); *B29K 2063/00* (2013.01); *B29K 2071/00* (2013.01); *B29K 2105/0002* (2013.01)

(58) Field of Classification Search
    CPC ...... C08G 59/24; C08G 65/18; B29C 59/022; B29K 2105/0002; B29K 2071/00; B29K 2063/00
    See application file for complete search history.

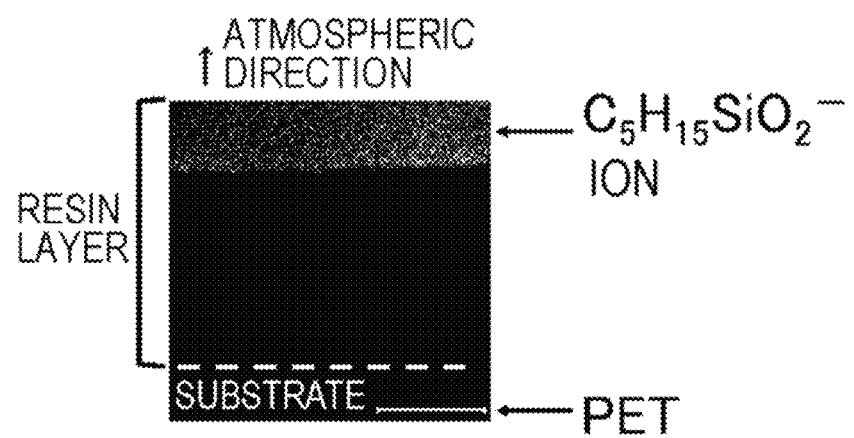

PHOTOCURABLE COMPOSITION, METHOD FOR PRODUCING CONCAVE-CONVEX STRUCTURE, METHOD FOR FORMING FINE CONCAVE-CONVEX PATTERN, AND CONCAVE-CONVEX STRUCTURE

TECHNICAL FIELD

The present invention relates to a photocurable composition, a method for producing a concave-convex structure, a method for forming a fine concave-convex pattern, and a concave-convex structure.

BACKGROUND ART

A photolithography method or a nanoimprint method is known as a method for forming a fine concave-convex pattern on a surface of a substrate.

The photolithography method involves an expensive device and a complicated process. On the other hand, the nanoimprint method has an advantage that a fine concave-convex pattern can be produced on the surface of a substrate by a simple device and a simple process. In addition, the nanoimprint method is considered to be a preferable method for forming relatively wide and deep concave-convex structures and various shapes such as a dome shape, a quadrangular pyramid shape, and a triangular pyramid shape.

Usually, in an industrial nanoimprint method, first, an expensive mother mold is produced in which a fine concave-convex structure on the surface thereof is formed by a photolithography method or an electron beam lithography method. Next, an inexpensive replica mold is produced in which the concave-convex structure of the mother mold is duplicated with an organic material. The replica mold finishes its role in a case where a substrate to be processed is processed with a certain number of repeated uses in consideration of productivity. Industrially, the replica mold is required to have a function that can withstand repeated uses. Increasing the number of repeated uses contributes to cost reduction.

As a specific process of the nanoimprint method, a UV method is widely used in which a photocurable composition is brought into contact with a concave-convex surface of a mold, cured by irradiation with light (UV), and then peeled off. Unlike a hot-melt pressing method, the UV method has advantages that it does not require large-scale heating and pressing equipment, and that a continuous method such as a roll-to-roll process can be easily assembled.

A material that has relatively good repeatability in the adaptation as a replica mold is disclosed (for example, Patent Document 1).

According to Patent Document 1, a composition including an acrylate, a silicone-based macromonomer, and an initiator is heat-polymerized, and the obtained resin composition is brought into contact with a concave-convex surface of a mother mold to produce a replica mold by a hot-melt pressing method. Then, in UV nanoimprinting with a photocurable compound, relatively good repeatability of about 20 times is realized.

However, the material described in Patent Document 1 requires hot-melt pressing at the time of producing a replica mold. That is, even in a case where a pattern area is formed with a concave-convex structure of several centimeters square, it is necessary to apply a high pressure of 20 MPa with a device equipped with a heating mechanism in order to fill the concave-convex structure of the mold with a resin. Therefore, the adaptation to an industrial process is very limited from the viewpoint of the production method of a replica mold.

In addition, as a material capable of being adapted to UV nanoimprinting, Patent Document 2 discloses a specific cation-curable material as a material having excellent coatability, rapid curability and thin film curability, and exhibiting excellent shape transferability in the nanoimprint method. Patent Document 2 discloses that it can be used 50 times for repetitive transferability.

However, Patent Document 2 relates to an imprint having a pattern shape of 1 to 2 micrometers in size. There is no description about nano-sized pattern formation.

Furthermore, in the adaptation of the replica mold, an adaptation in which a replica mold produced first is repeatedly used using the same material for which the replica mold is produced is not described in any of the disclosure examples.

RELATED DOCUMENT

Patent Document

[Patent Document 1] Pamphlet of International Publication No. WO 2012/018043
[Patent Document 2] Japanese Unexamined Patent Publication No. 2018-141028

SUMMARY OF THE INVENTION

Technical Problem

According to the findings of the present inventors, in the adaptation of a nanoimprint method to an industrial production method, a related art has not satisfied both of the conditions in terms of the entire process including a production step of a replica mold and the degree of freedom in shape (size) of a substrate to be processed. In particular, there is room for improvement in a photocurable composition used for forming a resin mold for nanoimprinting represented by a replica mold.

The present invention has been made in view of the above circumstances. Specifically, an object of the present invention is to provide a photocurable composition used for forming a resin mold that can be repeatedly used in the adaptation as a replica mold.

Solution to Problem

The Present Invention is as Follows

1. A photocurable composition used for forming a resin layer of a concave-convex structure including a substrate and
a resin layer provided on the substrate and having fine concavities and convexities formed on a surface thereof,
in which the photocurable composition has a surface free energy of 15 mJ/m$^2$ to 40 mJ/m$^2$ as measured by the following evaluation method 1, and
a hardness of 0.05 GPa to 0.5 GPa as measured by the following evaluation method 2.

Evaluation Method 1

First, the photocurable composition is coated on a substrate to form a photocurable film, which is then irradiated with ultraviolet rays to obtain a cured film.

Next, contact angles of water, diiodomethane, and 1-bromonaphthalene with respect to the cured film are measured using a contact angle meter.

Then, the surface free energy is calculated from the Kitazaki-Hata theory.

Evaluation Method 2

First, a cured film is obtained in the same manner as in the evaluation method 1.

Next, using a nanoindenter, a Berkovich indenter is pressed against the cured film, and the hardness is calculated from a value of the detected stress.

2.

The photocurable composition according to 1, in which the photocurable composition includes (a) photocurable monomer or photocurable monomer and binder resin, and (b) additive having a photoreactive functional group, and a content of (b) additive having a photoreactive functional group is 0.001% by mass to 10% by mass with respect to a total amount of (a) photocurable monomer or photocurable monomer and binder resin, and (b) additive having a photoreactive functional group.

3.

The photocurable composition according to 2, in which (b) additive having a photoreactive functional group includes an additive represented by General Formula (1) and/or an additive containing a structure represented by General Formula (2).

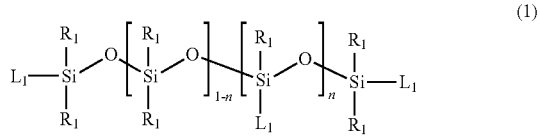

In General Formula (1)

$R_1$'s are the same or different from one another and represent any atom or group selected from the group consisting of a hydrogen atom, a fluorine atom, a halogen atom, a hydrocarbon group having 1 to 20 carbon atoms, an aryl group having 6 to 20 carbon atoms, an aralkyl group having 6 to 20 carbon atoms, a polyether group having 1 to 20 carbon atoms, and a fluorocarbon group having 1 to 20 carbon atoms, at least one of $L_1$'s contains a photoreactive functional group selected from the group consisting of an epoxy group, a hydroxyl group, an amino group, a vinyl ether group, a lactone group, a propenyl ether group, an olefin group, an oxetanyl group, a vinyl group, an acrylate group, a carbinol group, and a carboxy group, and in a case where $L_1$ is not a photoreactive functional group, $L_1$'s are the same or different from one another and represent an atom or group selected from $R_1$, and n and 1−n represent a ratio of each unit.

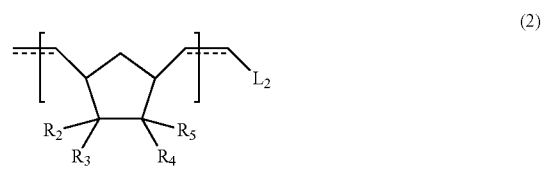

In General Formula (2)

$L_2$ is a photoreactive functional group selected from the group consisting of an epoxy group, an amino group, a vinyl ether group, a lactone group, a propenyl ether group, an alcohol group, an olefin group, an oxetanyl group, a vinyl group, an acrylate group, a carbinol group, and a carboxy group, at least one of $R_2$ to $R_5$ is a fluorine-containing group selected from the group consisting of fluorine, a fluorine-containing alkyl group having 1 to 10 carbon atoms, a fluorine-containing alkoxy group having 1 to 10 carbon atoms, and a fluorine-containing alkoxyalkyl group having 2 to 10 carbon atoms, in a case where $R_2$ to $R_5$ are not fluorine-containing groups, $R_2$ to $R_5$ are organic groups selected from the group consisting of hydrogen, an alkyl group having 1 to 10 carbon atoms, an alkoxy group having 1 to 10 carbon atoms, and an alkoxyalkyl group having 2 to 10 carbon atoms, $R_2$ to $R_5$ may be the same or different from one another, and $R_2$ to $R_5$ may be bonded to each other to form a ring structure, and a dotted line indicates that a bond of the portion thereof may be a carbon-carbon single bond or a carbon-carbon double bond.

4.

The photocurable composition according to any one of 1 to 3, in which the photocurable composition includes a photo-curing initiator.

5.

The photocurable composition according to 2 or 3, in which the photocurable monomer includes a cationically polymerizable compound having a ring-opening polymerizable group.

6.

A method for producing a concave-convex structure including a substrate and a resin layer provided on the substrate and having fine concavities and convexities formed on a surface thereof, using the photocurable composition according to any one of 1 to 5, the method including:

a pressing step of pressing a mold having a fine concave-convex pattern against a photocurable layer provided with the photocurable composition on a substrate to form a fine concave-convex pattern corresponding to the fine concave-convex pattern on a surface of the resin layer.

7.

The method for producing a concave-convex structure according to 6, further including:

a light irradiation step of curing the photocurable layer to form a cured layer by irradiating the photocurable layer with light while the mold is pressed, after the pressing step; and a peeling step of peeling the mold from the cured layer.

8.

A method for forming a fine concave-convex pattern by repeatedly using a substrate which is provided with a resin layer having fine concavities and convexities formed on a surface thereof and formed of the photocurable composition according to any one of 1 to 5.

9.

A concave-convex structure including:

a substrate; and a resin layer provided on the substrate, having fine concavities and convexities formed on a surface thereof, and formed of the photocurable composition according to any one of 1 to 4.

Advantageous Effects of Invention

By using the photocurable composition of the present invention, it is possible to obtain a concave-convex structure that can be repeatedly used in the adaptation as a replica mold.

BRIEF DESCRIPTION OF THE DRAWINGS

FIG. 1 shows a result of mapping a cross section of a replica mold B-1 produced from a photocurable composition (1) according to Example 1 by time-of-flight secondary ion mass spectrometry (TOF-SIMS).

DESCRIPTION OF EMBODIMENTS

Hereinafter, embodiments of the present invention will be described.

Unless otherwise specified, the description of "A to B" regarding a numerical range indicates that it is equal to or more than A and equal to or less than B. For example, the description of "1% to 5%" means equal to or more than 1% and equal to or less than 5%.

In the present specification, the photocurable composition of the present invention may be referred to as "first photocurable composition". In addition, a substrate having a resin layer having a fine concave-convex structure formed on a surface thereof using the first photocurable composition may be referred to as a replica mold, and a photocurable composition used for processing a substrate to be processed using the replica mold may be referred to as a "second photocurable composition".

In a case where substitution or non-substitution is not explicitly indicated in the description of a group (atomic group) in the present specification, the group (atomic group) is intended to include both a group (atomic group) having no substituent and a group (atomic group) having a substituent. For example, the term "alkyl group" includes not only an alkyl group having no substituent (unsubstituted alkyl group) but also an alkyl group having a substituent (substituted alkyl group).

Photocurable Composition

The photocurable composition of the present embodiment is used for forming a resin layer in a concave-convex structure including a substrate and a resin layer provided on the substrate and having fine concavities and convexities formed on a surface thereof.

The photocurable composition of the present embodiment preferably includes (a) photocurable monomer or photocurable monomer and binder resin, and (b) additive having a photoreactive functional group.

The content of (b) additive having a photoreactive functional group is preferably 0.001% by mass to 10% by mass with respect to the total amount of (a) and (b).

Hereinafter, individual components that can constitute the photocurable composition will be described. As a reminder, the photocurable composition of the present embodiment preferably includes the components which will be described later, but may not include the components which will be described later, as long as the characteristic values measured by (Evaluation method 1) and (Evaluation method 2) which will be described later are within a predetermined range.

Photocurable Monomer

Examples of the photocurable monomer include a compound having a reactive double bond group and a cationically polymerizable ring-opening polymerizable compound. In particular, the photocurable monomer is preferably a cationically polymerizable ring-opening polymerizable compound (specifically, a compound containing a ring-opening polymerizable group such as an epoxy group or an oxetanyl group) that has small curing shrinkage and good dimensional reproducibility of a concave-convex shape.

The photocurable monomer may have one reactive group or a plurality of reactive groups in one molecule. Preferably, a compound having two or more reactive groups in one molecule is used. The upper limit of the number of reactive groups in one molecule is not particularly limited, but is, for example, two, preferably four.

Only one type of photocurable monomer may be used, or two or more types of photocurable monomers may be used. In a case where two or more types of photocurable monomers are used, compounds having different reactive groups may be mixed and used at a certain ratio. In addition, a compound having a reactive double bond group and a cationically polymerizable ring-opening polymerizable compound may be mixed and used at a certain ratio.

In addition, by appropriately selecting the type and composition ratio of the photocurable monomer, it is possible to efficiently form a three-dimensional network structure inside and on the surface after light irradiation curing. As a result, the resin hardness which will be described later can be maintained in an appropriate range.

Specific examples of the case where the photocurable monomer is a compound having a reactive double bond group include the following compounds.

Olefins such as fluorodienes ($CF_2$=$CFOCF_2CF_2CF$=$CF_2$, $CF_2$=$CFOCF_2CF(CF_3)CF$=$CF_2$, $CF_2$=$CFCF_2C(OH)(CF_3)CH_2CH$=$CH_2$, $CF_2$=$CFCF_2C(OH)(CF_3)CH$=$CH_2$, $CF_2$=$CFCF_2C(CF_3)(OCH_2OCH_3)CH_2CH$=$CH_2$, and $CF_2$=$CFCH_2C(C(CF_3)_2OH)(CF_3)CH_2CH$=$CH_2$, and the like).

Cyclic olefins such as norbornene and norbornadiene.

Alkyl vinyl ethers such as cyclohexyl methyl vinyl ether, isobutyl vinyl ether, cyclohexyl vinyl ether, and ethyl vinyl ether.

Vinyl esters such as vinyl acetate.

(Meth)acrylic acid, derivatives thereof or fluorine-containing acrylates thereof, and polyfunctional acrylates such as (meth)acrylic acid, phenoxyethyl acrylate, benzyl acrylate, stearyl acrylate, lauryl acrylate, 2-ethylhexyl acrylate, allyl acrylate, 1,3-butanediol diacrylate, 1,4-butanediol diacrylate, 1,6-hexanediol diacrylate, trimethylolpropane triacrylate, pentaerythritol triacrylate, dipentaerythritol hexaacrylate, ethoxyethyl acrylate, methoxyethyl acrylate, glycidyl acrylate, tetrahydrofurfuryl acrylate, diethylene glycol diacrylate, neopentyl glycol diacrylate, polyoxyethylene glycol diacrylate, tripropylene glycol diacrylate, 2-hydroxyethyl acrylate, 2-hydroxypropyl acrylate, 4-hydroxybutyl vinyl ether, N,N-diethylaminoethyl acrylate, N,N- dimethylaminoethyl acrylate, N-vinylpyrrolidone, dimethylaminoethyl methacrylate, methyl methacrylate, trifluoroethyl methacrylate, and benzyl methacrylate.

Examples of the cationically polymerizable ring-opening polymerizable compound among the photocurable monomers include the following compounds. These compounds are preferable from the viewpoint of long-term storage stability and suppression of deterioration of dimensional accuracy of a concave-convex structure due to curing shrinkage.

Epoxy compounds including alicyclic epoxy resins such as 1,7-octadiene diepoxide, 1,2-epoxydecane, 1,2-epoxydodecane, 2-ethylhexyl glycidyl ether, cyclohexene epoxide, alpha-pinene oxide, dicyclopentadiene oxide, limonene monooxide, limonene dioxide, 4-vinylcyclohexene dioxide, 3,4-epoxycyclohexylmethyl-3',4'-epoxycyclohexanecarboxylate, di(3,4-epoxycyclohexyl)adipate, (3,4-epoxycyclohexyl)methyl alcohol, 1,2-epoxy-4-vinylcyclohexane, (3,4-epoxy-6-methylcyclohexyl)methyl-3,4-epoxy-6-methylcyclohexa necarboxylate, ethylene 1,2-di(3,4-epoxycyclohexane carboxylic acid)ester, [(3,4-epoxycyclohexan)-1-yl] methyl methacrylate, (3,4-epoxycyclohexyl)ethyltrimethoxysilane, 2-ethylhexyl glycidyl ether, phenylglycidyl ether, dicyclohexyl-3,3'-diepoxide, a bisphenol A type epoxy resin, a halogenated bisphenol A type epoxy resin, a bisphenol F type epoxy resin, epoxidized polybutadiene, an o-, m-, or p-cresol novolac type epoxy resin, a phenol novolac type epoxy resin, polyhydric alcohol polyglycidyl ether, a 1,2-epoxy-4-(2-oxiranyl)cyclohexane adduct of 2,2-bis(hydroxymethyl)-1-butanol, an adduct of 3,4-epoxycyclohexylmethyl-3',4'-epoxycyclohexanecarboxylate with ε-caprolactone, bis(3,4-epoxycyclohexan-1-ylmethyl) adipate, and 3,4-epoxycyclohexenylmethyl-3',4'-epoxycyclohexene carboxylate; and epoxy compounds such as hydrogenated bisphenol A glycidyl ether and glycidyl ester.

Oxetane compounds, for example compounds having one oxetanyl group, such as 3-methyl-3-(butoxymethyl)oxetane, 3-methyl-3-(pentyloxymethyl)oxetane, 3-methyl-3-(hexyloxymethyl)oxetane, 3-methyl-3-(2-ethylhexyloxymethyl)oxetane, 3-methyl-3-(octyloxymethyl)oxetane, 3-methyl-3-(decanoloxymethyl)oxetane, 3-methyl-3-(dodecanoloxymethyl))oxetane, 3-methyl-3-(phenoxymethyl)oxetane, 3-ethyl-3-(butoxymethyl)oxetane, 3-ethyl-3-(pentyloxymethyl)oxetane, 3-ethyl-3-(hexyloxymethyl))oxetane, 3-ethyl-3-(2-ethylhexyloxymethyl)oxetane, 3-ethyl-3-(octyloxymethyl)oxetane, 3-ethyl-3-(decanoloxymethyl)oxetane, 3-ethyl-3-(dodecanoloxymethyl)oxetane, 3-(cyclohexyloxymethyl)oxetane, 3-methyl-3-(cyclohexyloxymethyl)oxetane, 3-ethyl-3-(cyclohexyloxymethyl)oxetane, 3-ethyl-3-(phenoxymethyl)oxetane, 3,3-dimethyloxetane, 3-hydroxymethyloxetane, 3-methyl-3-hydroxymethyloxetane, 3-ethyl-3-hydroxymethyloxetane, 3-ethyl-3-phenoxymethyloxetane, 3-n-propyl-3-hydroxymethyloxetane, 3-isopropyl-3-hydroxymethyloxetane, 3-n-butyl-3-hydroxymethyloxetane, 3-isobutyl-3-hydroxymethyloxetane, 3-sec-butyl-3-hydroxymethyloxetane, 3-tert-butyl-3-hydroxymethyloxetane, 3-ethyl-3-(2-ethylhexyl)oxetane, and 3-ethyl-3-[(2-ethylhexyloxy)methyl]oxetane; and compounds having two or more oxetanyl groups, such as bis(3-ethyl-3-oxetanylmethyl) ether, 1,2-bis[(3-ethyl-3-oxetanylmethoxy)]ethane, 1,3-bis[(3-ethyl-3-oxetanylmethoxy)] propane, 1,3-bis[(3-ethyl-3-oxetanylmethoxy)]-2,2-dimethyl-propane, 1,4-bis(3-ethyl-3-oxetanylmethoxy) butane, 1,6-bis(3-ethyl-3-oxetanylmethoxy)hexane, 1,4-bis [(3-methyl-3-oxetanyl)methoxy]benzene, 1,3-bis[(3-methyl-3-oxetanyl)methoxy]benzene, 1,4-bis{[(3-methyl-3-oxetanyl)methoxy]methyl}benzene, 1,4-bis{[(3-methyl-3-oxetanyl)methoxy]methyl}cyclohexane, 4,4'-bis{[(3-methyl-3-oxetanyl)methoxy]methyl}biphenyl, 4,4'-bis{[(3-methyl-3-oxetanyl)methoxy]methyl}bicyclohexane, 2,3-bis [(3-methyl-3-oxetanyl)methoxy]bicyclo[2.2.1]heptane, 2,5-bis[(3-methyl-3-oxetanyl)methoxy]bicyclo[2.2.1]heptane, 2,6-bis[(3-methyl-3-oxetanyl)methoxy]bicyclo[2.2.1]heptane, 1,4-bis[(3-ethyl-3-oxetanyl)methoxy]benzene, 1,3-bis [(3-ethyl-3-oxetanyl)methoxy]benzene, 1,4-bis{[(3-ethyl-3-oxetanyl)methoxy]methyl}benzene, 1,4-bis{[(3-ethyl-3-oxetanyl)methoxy]methyl}cyclohexane, 4,4'-bis{[(3-ethyl-3-oxetanyl)methoxy]methyl}biphenyl, 4,4'-bis{[(3-ethyl-3-oxetanyl)methoxy]methyl}bicyclohexane, 2,3-bis[(3-ethyl-3-oxetanyl)methoxy]bicyclo[2.2.1]heptane, 2,5-bis[(3-ethyl-3-oxetanyl)methoxy]bicyclo[2.2.1]heptane, 2,6-bis [(3-ethyl-3-oxetanyl)methoxy]bicyclo[2.2.1]heptane, and xylylene bisoxetane.

Lactone Compounds

Propenyl ether compounds and the like.

The content of the photocurable monomer in the photocurable composition is preferably 10% by mass to 99.5% by mass, more preferably 20% by mass to 99.5% by mass, and still more preferably 30% by mass to 99.5% by mass based on the entire photocurable composition (100% by mass). In addition, in a case where the photocurable composition includes a binder resin which will be described later, the content of the binder resin is preferably 50% by mass to 99.5% by mass, more preferably 60% by mass to 99.5% by mass, and still more preferably 70% by mass to 99.5% by mass. In any case, the photocurable monomers may be used alone or in combination of two or more thereof.

By adjusting the content of the photocurable monomer in the above range, a three-dimensional network structure can be effectively formed on the surface and/or inside of the cured resin layer. Then, it is easy to adjust the resin hardness, which will be described later, within an appropriate range.

Binder Resin

The binder resin refers to, for example, a polymer obtained by prepolymerizing the above-mentioned photocurable monomer, or a polymer obtained by polymerizing the monomer by another method.

From the viewpoint of compatibility with the curable monomer and physical properties of the film after curing, for example, a polymer obtained by prepolymerizing the above-mentioned photocurable monomer or an amorphous cyclic olefin polymer is preferable as the binder resin.

In addition, a polyacrylic resin, a polyether resin, a polyoxetanyl resin, a polyester resin, a cyclic olefin polymer, and the like can also be mentioned as the preferable binder resin.

The cyclic olefin polymer may be, for example, a fluorine-containing cyclic olefin polymer represented by General Formula (1), as disclosed in Japanese Patent No. 5466705. Unlike ordinary fluororesins, this fluorine-containing cyclic olefin polymer has an appropriate dipole moment due to the characteristics of the arrangement of fluorine atoms and fluorine-containing substituents. Therefore, while having the characteristics of a fluororesin, this fluorine-containing cyclic olefin polymer tends to be compatible with a general-purpose organic solvent and other components in the photocurable composition. As a result, there is an advantage that uniform dissolution is achieved at the time of preparing a composition, compatibility is favorable even in the form after light irradiation curing, and a uniform transparent cured resin layer can be obtained without causing whitening or the like.

In a case where the binder resin is used, the amount thereof is preferably 0.1% by mass to 50% by mass, more preferably 0.5% by mass to 40% by mass, and still more preferably 1% by mass to 30% by mass based on the entire photocurable composition (100% by mass). The binder resins may be used alone or in combination of two or more thereof in a case of being used.

By adjusting the content of the binder resin within the above range, the viscosity of the photocurable composition can be adjusted. For example, it is possible to increase the viscosity to suppress dripping during coating, or to improve defects in uniformity due to fluctuations in the coated surface.

The weight average molecular weight of the binder resin is preferably 500 to 100000, more preferably 500 to 80000, and still more preferably 500 to 50000 as measured by GPC of polystyrene standard, from the viewpoint of compatibility with other components in the photocurable composition. By adjusting the weight average molecular weight of the binder resin within this range, it is easy to obtain a photocurable composition that has good compatibility with other components in the photocurable composition and can be stably stored for a long period of time.

Additive Having Photoreactive Functional Group

The additive having a photoreactive functional group is preferably unevenly distributed on a surface of a film in a case where the photocurable composition of the present embodiment is formed into a film. This makes it possible to adjust the surface free energy of the surface of the cured film, which will be described later.

The additive having a photoreactive functional group is preferably a compound capable of binding to the above-mentioned photocurable monomer due to the presence of the photoreactive functional group. This prevents a part of the replica mold from migrating to a second photocurable composition used for processing a substrate to be processed, in repeated use of the replica mold, which makes it easy to maintain good surface texture of the replica mold. That is, the repetitive usability of the replica mold can be improved.

In addition, the additive having a photoreactive functional group is preferably unevenly distributed on a surface of a resin layer in a case where the resin layer is formed. According to the findings of the present inventors, for example, a siloxane compound and a fluoropolymer having a specific cyclic structure, which will be described later, are effectively unevenly distributed in the vicinity of the film surface due to the presence of silicon atoms and fluorine atoms. As a result, the surface free energy and hardness of the film surface are controlled. Then, it is considered that the repetitive usability of the replica mold is improved.

Examples of the additive having a photoreactive functional group include a compound having a reactive double bond group as the photoreactive functional group and a cationically polymerizable compound having a ring-opening polymerizable group. Preferably, a cationically polymerizable ring-opening polymerizable compound (specifically, a compound having a ring-opening polymerizable group such as an epoxy group, an oxetanyl group, an amino group, a vinyl ether group, or an alcohol group, or capable of directly bonding to a ring-opening polymerizable group) is preferable.

The additive having a photoreactive functional group may have one or a plurality of photoreactive groups in one molecule. Preferably, the additive having a photoreactive functional group has two or more photoreactive groups in one molecule. The upper limit of the number of reactive groups in one molecule is not particularly limited, but is, for example, two, preferably four.

Only one type of additive having a photoreactive functional group may be used, or two or more types thereof may be used. In a case where two or more types of additives having a photoreactive functional group are used, compounds having different numbers of reactive groups may be mixed and used at a certain ratio. Further, a compound having a reactive double bond group and a cationically polymerizable ring-opening polymerizable compound may be mixed and used at a certain ratio.

The content of the additive having a photoreactive functional group in the photocurable composition is preferably 0.001% by mass to 10% by mass, more preferably 0.005% by mass to 8% by mass, and still more preferably 0.01% by mass to 5% by mass with respect to the total amount (100% by mass) of (a) photocurable monomer or photocurable monomer and binder resin, and (b) additive having a photoreactive functional group.

By adjusting the amount of the additive having a photoreactive functional group within this range, for example, the additive can be efficiently unevenly distributed on the film surface. Then, it is easy to adjust the surface free energy which will be described later to an appropriate range. Then, in the production of the concave-convex structure, the resin adhesion is suppressed in a peeling step and therefore the peelability is enhanced. In addition, defects in the replica mold are suppressed, which results in improved repetitive usability of the replica mold.

The additive having a photoreactive functional group may be, for example, a siloxane compound having a photoreactive functional group. More specifically, a siloxane compound of General Formula (1) below can be mentioned as the additive having a photoreactive functional group.

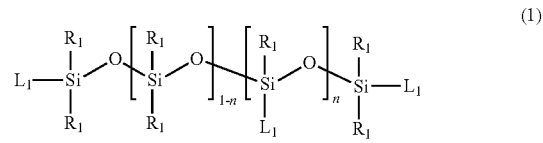

In General Formula (1), $R_1$'s are the same or different from one another and represent any atom or group selected from the group consisting of a hydrogen atom, a fluorine atom, a halogen atom, a hydrocarbon group having 1 to 20 carbon atoms, an aryl group having 6 to 20 carbon atoms, an aralkyl group having 6 to 20 carbon atoms, a polyether group having 1 to 20 carbon atoms, and a fluorocarbon group having 1 to 20 carbon atoms, at least one of $L_1$'s contains a photoreactive functional group selected from the group consisting of an epoxy group, a hydroxyl group, an amino group, a vinyl ether group, a lactone group, a propenyl ether group, an olefin group, an oxetanyl group, a vinyl group, an acrylate group, a carbinol group, and a carboxy group, and in a case where $L_1$ is not a photoreactive functional group, $L_1$'s are the same or different from one another and represent an atom or group selected from $R_1$, and n and 1−n represent a ratio of each unit, and n is usually represented in a range of 0 to 1.

A commercially available product may be used as the siloxane compound having a photoreactive functional group. For example, a polysiloxane having a photoreactive functional group at a main chain terminal/a side chain thereof, a compound corresponding to General Formula (1), or the like can be selected and used from commercially available reactive group-containing siloxane compounds.

Examples of commercially available products of the epoxy group-containing siloxane compound include X-22-343 (manufactured by Shin-Etsu Silicone Co., Ltd.), KF-101 (manufactured by Shin-Etsu Silicone Co., Ltd.), KF-1001 (manufactured by Shin-Etsu Silicone Co., Ltd.), X-22-2000 (manufactured by Shin-Etsu Silicone Co., Ltd.), X-22-2046 (manufactured by Shin-Etsu Silicone Co., Ltd.), KF-102 (manufactured by Shin-Etsu Silicone Co., Ltd.), X-22-4741 (manufactured by Shin-Etsu Silicone Co., Ltd.), KF-1002 (manufactured by Shin-Etsu Silicone Co., Ltd.), X-22-3000T (manufactured by Shin-Etsu Silicone Co., Ltd.), X-22-163 (manufactured by Shin-Etsu Silicone Co., Ltd.), KF-105 (manufactured by Shin-Etsu Silicone Co., Ltd.), X-22-163A (manufactured by Shin-Etsu Silicone Co., Ltd.), X-22-163B (manufactured by Shin-Etsu Silicone Co., Ltd.), X-22-163C (manufactured by Shin-Etsu Silicone Co., Ltd.), X-22-169AS (manufactured by Shin-Etsu Silicone Co., Ltd.), X-22-169B (manufactured by Shin-Etsu Silicone Co., Ltd.), X-22-173DX (manufactured by Shin-Etsu Silicone Co., Ltd.), X-22-9002 (manufactured by Shin-Etsu Silicone Co., Ltd.), SF 8411 (manufactured by Dow Corning Toray Co., Ltd.), SF 8413 (manufactured by Dow Corning Toray Co., Ltd.), SF 8421 (manufactured by Dow Corning Toray Co., Ltd.), BY16-839 (manufactured by Dow Corning Toray Co., Ltd.), BY16-876 (manufactured by Dow Corning Toray Co., Ltd.), and FZ-3736 (manufactured by Dow Corning Toray Co., Ltd.).

Specific examples of commercially available products of the hydroxyl group-containing siloxane compound include YF3800 (manufactured by Momentive Performance Materials Japan LLC.), XF3905 (manufactured by Momentive Performance Materials Japan LLC.), X-21-5841 (manufactured by Shin-Etsu Silicone Co., Ltd.), KF-9701 (manufactured by Shin-Etsu Silicone Co., Ltd.), FM-0411 (manufactured by JNC Corporation), FM-0421 (manufactured by JNC Corporation), FM-0425 (manufactured by JNC Corporation), FM-DA11 (manufactured by JNC Corporation), FM-DA21 (manufactured by JNC Corporation), FM-DA26 (manufactured by JNC Corporation), FM-4411 (manufactured by JNC Corporation), FM-4421 (manufactured by JNC Corporation), and FM-4425 (manufactured by JNC Corporation).

Examples of commercially available products of the amino group-containing siloxane compound include KF-868 (manufactured by Shin-Etsu Silicone Co., Ltd.), KF-865 (manufactured by Shin-Etsu Silicone Co., Ltd.), KF-864 (manufactured by Shin-Etsu Silicone Co., Ltd.), KF-859 (manufactured by Shin-Etsu Silicone Co., Ltd.), KF-393 (manufactured by Shin-Etsu Silicone Co., Ltd.), KF-860 (manufactured by Shin-Etsu Silicone Co., Ltd.), KF-880 (manufactured by Shin-Etsu Silicone Co., Ltd.), KF-8004 (manufactured by Shin-Etsu Silicone Co., Ltd.), KF-8002 (manufactured by Shin-Etsu Silicone Co., Ltd.), KF-8005 (manufactured by Shin-Etsu Silicone Co., Ltd.), KF-862 (manufactured by Shin-Etsu Silicone Co., Ltd.), X-223820W (manufactured by Shin-Etsu Silicone Co., Ltd.), KF-869 (manufactured by Shin-Etsu Silicone Co., Ltd.), KF-861 (manufactured by Shin-Etsu Silicone Co., Ltd.), X-22-3939A (manufactured by Shin-Etsu Silicone Co., Ltd.), KF-877 (manufactured by Shin-Etsu Silicone Co., Ltd.), PAM-E (manufactured by Shin-Etsu Silicone Co., Ltd.), KF-8010 (manufactured by Shin-Etsu Silicone Co., Ltd.), X-22-161A (manufactured by Shin-Etsu Silicone Co., Ltd.), X-22-161B (manufactured by Shin-Etsu Silicone Co., Ltd.), KF-8012 (manufactured by Shin-Etsu Silicone Co., Ltd.), KF-8008 (manufactured by Shin-Etsu Silicone Co., Ltd.), X-22-1660B-3 (manufactured by Shin-Etsu Silicone Co., Ltd.), KF-857 (manufactured by Shin-Etsu Silicone Co., Ltd.), KF-8001 (manufactured by Shin-Etsu Silicone Co., Ltd.), KF-862 (manufactured by Shin-Etsu Silicone Co., Ltd.), X-22-9192 (manufactured by Shin-Etsu Silicone Co., Ltd.), and KF-868 (manufactured by Shin-Etsu Silicone Co., Ltd.).

Examples of commercially available products of the carbinol group-containing siloxane compound include X-22-4039 (manufactured by Shin-Etsu Silicone Co., Ltd.), X-22-4015 (manufactured by Shin-Etsu Silicone Co., Ltd.), X-22-160AS (manufactured by Shin-Etsu Silicone Co., Ltd.), KF-6001 (manufactured by Shin-Etsu Silicone Co., Ltd.), KF-6002 (manufactured by Shin-Etsu Silicone Co., Ltd.), KF-6003 (manufactured by Shin-Etsu Silicone Co., Ltd.), X-22-170BX (manufactured by Shin-Etsu Silicone Co., Ltd.), and X-22-170DX (manufactured by Shin-Etsu Silicone Co., Ltd.).

Examples of commercially available products of the carboxy group-containing siloxane compound include X-22-3701E (manufactured by Shin-Etsu Silicone Co., Ltd.), X-22-162C (manufactured by Shin-Etsu Silicone Co., Ltd.), and X-22-3710 (manufactured by Shin-Etsu Silicone Co., Ltd.).

Examples of commercially available products of the acrylate group-containing siloxane compound include X-22-164 (manufactured by Shin-Etsu Silicone Co., Ltd.), X-22-174BX (manufactured by Shin-Etsu Silicone Co., Ltd.), X-22-2426 (manufactured by Shin-Etsu Silicone Co., Ltd.), FM-0711 (manufactured by JNC Corporation), FM-0711 (manufactured by JNC Corporation), FM-0721 (manufactured by JNC Corporation), FM-7711 (manufactured by JNC Corporation), FM-7725 (manufactured by JNC Corporation), and TM-0701T (manufactured by JNC Corporation).

Of these compounds, a cationically polymerizable epoxy group-containing siloxane compound and/or a hydroxyl group-containing siloxane compound is preferably selected.

The weight average molecular weight (Mw) of the siloxane compound is preferably 200 to 50,000, more preferably 200 to 40,000, and still more preferably 200 to 30,000. By adjusting the molecular weight within this range, the compatibility with other components in the photocurable composition is enhanced. In addition, it is easy to obtain a sufficient surface uneven distribution effect in a case of forming a film.

The range of n in General Formula (1) is preferably 0 to 1, more preferably 0.1 to 1, and still more preferably 0.3 to 1. The range of n is suitably selected in consideration of the types of $R_1$ and $L_1$ and the property of being compatible with other components constituting the photocurable composition (compatibility, curability, repeatability of the produced replica mold, and the like).

Another example of the additive having a photoreactive functional group may be a fluorine-containing cyclic olefin polymer (specifically, a fluorine-containing cyclic olefin polymer having a photoreactive functional group at a side chain/terminal thereof). More specifically, the fluorine-containing cyclic olefin polymer may be, for example, a specific fluorine-containing cyclic olefin polymer represented by General Formula (2).

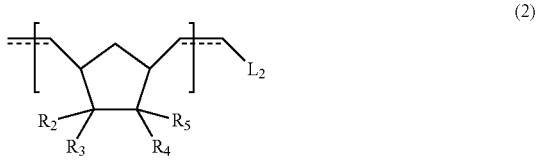

(2)

In General Formula (2), $L_2$ is a photoreactive functional group selected from the group consisting of an epoxy group, an amino group, a vinyl ether group, a lactone group, a propenyl ether group, an alcohol group, an olefin group, an oxetanyl group, a vinyl group, an acrylate group, a carbinol group, and a carboxy group, at least one of $R_2$ to $R_5$ is a fluorine-containing group selected from the group consisting of fluorine, a fluorine-containing alkyl group having 1 to 10 carbon atoms, a fluorine-containing alkoxy group having 1 to 10 carbon atoms, and a fluorine-containing alkoxyalkyl group having 2 to 10 carbon atoms, in a case where $R_2$ to $R_5$ are not fluorine-containing groups, $R_2$ to $R_5$ are organic groups selected from the group consisting of hydrogen, an alkyl group having 1 to 10 carbon atoms, an alkoxy group having 1 to 10 carbon atoms, and an alkoxyalkyl group having 2 to 10 carbon atoms, $R_2$ to $R_5$ may be the same or different from one another, and $R_2$ to $R_5$ may be bonded to each other to form a ring structure, and a dotted line indicates that a bond of the portion thereof may be a carbon-carbon single bond or a carbon-carbon double bond.

In a case where $R_2$ to $R_5$ are fluorine-containing groups in General Formula (2), specific examples of the fluorine-containing group include: fluorine; an alkyl group having 1 to 10 carbon atoms in which hydrogens of the alkyl group are partially or completely substituted with fluorines, such as a fluoromethyl group, a difluoromethyl group, a trifluoromethyl group, a trifluoroethyl group, a pentafluoroethyl group, a heptafluoropropyl group, a hexafluoroisopropyl group, a heptafluoroisopropyl group, a hexafluoro-2-methylisopropyl group, a perfluoro-2-methylisopropyl group, an n-perfluorobutyl group, an n-perfluoropentyl group, or a perfluorocyclopentyl group; an alkoxy group having 1 to 10 carbon atoms in which hydrogens of the alkoxy group are partially or completely substituted with fluorines, such as a fluoromethoxy group, a difluoromethoxy group, a trifluoromethoxy group, a trifluoroethoxy group, a pentafluoroethoxy group, a heptafluoropropoxy group, a hexafluoroisopropoxy group, a heptafluoroisopropoxy group, a hexafluoro-2-methylisopropoxy group, a perfluoro-2-methylisopropoxy group, an n-perfluorobutoxy group, an n-perfluoropentoxy group, or a perfluorocyclopentoxy group; and an alkoxyalkyl group having 2 to 10 carbon atoms in which hydrogens of the alkoxyalkyl group are partially or completely substituted with fluorine, such as a fluoromethoxymethyl group, a difluoromethoxymethyl group, a trifluoromethoxymethyl group, a trifluoroethoxymethyl group, a pentafluoroethoxymethyl group, a heptafluoropropoxymethyl group, a hexafluoroisopropoxymethyl group, a heptafluoroisopropoxymethyl group, a hexafluoro-2-methylisopropoxymethyl group, a perfluoro-2-methyliso- propoxymethyl group, an n-perfluorobutoxymethyl group, an n-perfluoropentoxymethyl group, or perfluorocyclopentoxymethyl group.

$R_2$ to $R_5$ may be bonded to each other to form a ring structure. For example, $R_2$ to $R_5$ may be bonded to each other to form a ring such as perfluorocycloalkyl or oxygen-mediated perfluorocycloether.

In a case where $R_2$ to $R_5$ are not fluorine-containing groups, specific examples of $R_2$ to $R_5$ include hydrogen; an alkyl group having 1 to 10 carbon atoms such as a methyl group, an ethyl group, a propyl group, an isopropyl group, a 2-methylisopropyl group, an n-butyl group, an n-pentyl, or a cyclopentyl group; an alkoxy group having 1 to 10 carbon atoms such as a methoxy group, an ethoxy group, a propoxy group, a butoxy group, or a pentoxy group; and an alkoxyalkyl group having 2 to 10 carbon atoms such as a methoxymethyl group, an ethoxymethyl group, a propoxymethyl group, a butoxymethyl group, or a pentoxymethyl group.

$R_2$ to $R_5$ in General Formula (2) are each preferably fluorine or a fluoroalkyl group having 1 to 10 carbon atoms in which hydrogens of the alkyl group are partially or completely substituted with fluorines, such as a fluoromethyl group, a difluoromethyl group, a trifluoromethyl group, a trifluoroethyl group, a pentafluoroethyl group, a heptafluoropropyl group, a hexafluoroisopropyl group, a heptafluoroisopropyl group, a hexafluoro-2-methylisopropyl group, a perfluoro-2-methylisopropyl group, an n-perfluorobutyl group, an n-perfluoropentyl group, or a perfluorocyclopentyl group.

More preferably, a cationically polymerizable fluorine-containing cyclic olefin polymer in which $L_2$ is an epoxy group or a hydroxyl group is selected as the compound represented by General Formula (2).

In a case where the additive having a photoreactive functional group is a fluorine-containing cyclic olefin polymer, the additive having a photoreactive functional group may consist of only one structural unit represented by General Formula (2), or may consist of two or more structural units in which at least one of $R_2$ to $R_5$ in General Formula (2) is different from one another. In addition, the additive having a photoreactive functional group may be a polymer (copolymer) containing one or two or more structural units represented by General Formula (2) and a structural unit different from the structural unit represented by General Formula (2).

The fluorine-containing cyclic olefin polymer can be obtained by appropriately applying a known technique. For example, the fluorine-containing cyclic olefin polymer can be obtained by appropriately applying a known technique for ring-opening polymerization of cyclic olefins. Specific examples of polymerization conditions, catalysts used, and the like are described in Examples which will be described later.

As the main chain olefin in the fluorine-containing cyclic olefin polymer, a fluorine-containing cyclic olefin polymer represented by General Formula (2) having a saturated aliphatic structure by hydrogenation is preferably selected. The hydrogenation rate of the main chain olefin is preferably 50% to 100%, more preferably 70% to 100%, and still more preferably 90% to 100%.

In a case where the hydrogenation rate of the main chain olefin is in the above range, light absorption due to carbon-carbon double bonds is suppressed, making it easier for light to reach deep into the resin film, during photocuring. That is, the efficiency of photocuring is increased.

The hydrogenation reaction can be carried out by a known method. The hydrogenation reaction may be carried out by a method using a solid catalyst or a method using a homogeneous catalyst, and two or more types of these catalysts may be mixed and used. Preferably, a method using a solid catalyst in which the catalyst can be easily removed by filtration in a post-treatment after the reaction is suitably selected.

The weight average molecular weight (Mw) of the fluorine-containing cyclic olefin polymer is preferably 500 to 50,000, more preferably 500 to 40,000, and still more preferably 500 to 30,000. By adjusting the Mw within this range, compatibility with other components is enhanced, which makes it easy to prepare a uniform solution. In addition, adjusting the Mw within this range effectively facilitates segregation on the surface in a case of being formed as a film.

Photocuring Initiator

The photocurable composition of the present embodiment preferably includes a photocuring initiator.

Examples of the photocuring initiator include a photoradical initiator that generates a radical upon irradiation with light and a photocationic initiator that generates a cation upon irradiation with light.

Examples of the photoradical initiators that generate a radical upon irradiation with light include, among the photocuring initiators, acetophenones such as acetophenone, p-tert-butyltrichloroacetophenone, chloroacetophenone, 2,2-diethoxyacetophenone, hydroxyacetophenone, 2,2-dimethoxy-2'-phenylacetophenone, 2-aminoacetophenone, and dialkylaminoacetophenone; benzoins such as benzoin, benzoin methyl ether, benzoin ethyl ether, benzoin isopropyl ether, benzoin isobutyl ether, 1-hydroxycyclohexylphenylketone, 2-hydroxy-2-methyl-1-phenyl-2-methylpropan-1-one, and 1-(4-isopropylphenyl)-2-hydroxy-2-methylpropan-1-one; benzophenones such as benzophenone, benzoyl benzoate, methyl benzoyl benzoate, methyl-o-benzoyl benzoate, 4-phenylbenzophenone, hydroxybenzophenone, hydroxypropyl benzophenone, acrylic benzophenone, and 4,4'-bis(dimethylamino)benzophenone; thioxanthones such as thioxanthone, 2-chlorothioxanthone, 2-methylthioxanthone, diethylthioxanthone, and dimethylthioxanthone; fluorine-containing peroxides such as perfluoro(tert-butyl peroxide) and perfluorobenzoyl peroxide; α-acyloxime ester, benzyl-(o-ethoxycarbonyl)-α-monooxime, acylphosphine oxide, glyoxyester, 3-ketocoumarin, 2-ethylanthraquinone, camphorquinone, tetramethylthiuram sulfide, azobisisobutyronitrile, benzoyl peroxide, dialkyl peroxide, and tert-butylperoxypivalate. These photoradical initiators often exhibit their functions mainly in the UV region with a wavelength of light of 200 nm to 400 nm.

Examples of the preferably used photoradical initiator include IRGACURE 651 (manufactured by Ciba Specialty Chemicals Corporation), IRGACURE 184 (manufactured by Ciba Specialty Chemicals Corporation), DAROCUR 1173 (manufactured by Ciba Specialty Chemicals Corporation), benzophenone, 4-phenylbenzophenone, IRGACURE 500 (manufactured by Ciba Specialty Chemicals Corporation), IRGACURE 2959 (manufactured by Ciba Specialty Chemicals Corporation), IRGACURE 127 (manufactured by Ciba Specialty Chemicals Corporation), IRGACURE 907 (manufactured by Ciba Specialty Chemicals Corporation), IRGACURE 369 (manufactured by Ciba Specialty Chemicals Corporation), IRGACURE 1300 (manufactured by Ciba Specialty Chemicals Corporation), IRGACURE 819 (manufactured by Ciba Specialty Chemicals Corporation), IRGACURE 1800 (manufactured by Ciba Specialty Chemicals Corporation), DAROCUR TPO (manufactured by Ciba Specialty Chemicals Corporation), DAROCUR 4265 (manufactured by Ciba Specialty Chemicals Corporation), IRGACURE OXE01 (manufactured by Ciba Specialty Chemicals Corporation), IRGACURE OXE02 (manufactured by Ciba Specialty Chemicals Corporation), ESACURE-KT55 (manufactured by Lamberti S.p.A.), ESACURE-KIP150 (manufactured by Lamberti S.p.A.), ESACURE-KIP100F (manufactured by Lamberti S.p.A.), ESACURE-KT37 (manufactured by Lamberti S.p.A.), ESACURE-KT046 (manufactured by Lamberti S.p.A.), ESACURE-1001M (manufactured by Lamberti S.p.A.), ESACURE-KIP/EM (manufactured by Lamberti S.p.A.), ESACURE-DP250 (manufactured by Lamberti S.p.A.), ESACURE-KB1 (manufactured by Lamberti S.p.A.), and 2,4-diethylthioxanthone.

Among these photoradical initiators, examples of the more preferably used photoradical polymerization initiator include IRGACURE 184 (manufactured by Ciba Specialty Chemicals Corporation), DAROCUR 1173 (manufactured by Ciba Specialty Chemicals Corporation), IRGACURE 500 (manufactured by Ciba Specialty Chemicals Corporation), IRGACURE 819 (manufactured by Ciba Specialty Chemicals Corporation), DAROCUR TPO (manufactured by Ciba Specialty Chemicals Corporation), ESACURE-KIP100F (manufactured by Lamberti S.p.A.), ESACURE-KT37 (manufactured by Lamberti S.p.A.), and ESACURE-K1046 (manufactured by Lamberti S.p.A.).

Among the photocuring initiators, the photocationic initiator that generates a cation upon irradiation with light is not particularly limited as long as it is a compound that initiates cationic polymerization of the above-mentioned cationically polymerizable ring-opening polymerizable compound upon irradiation with light. Preferred is a compound that releases a Lewis acid through a photoreaction, such as an onium salt of an onium cation—a counter anion thereof. These compounds often exhibit their functions mainly in the UV region with a wavelength of light of 200 nm to 400 nm.

Examples of the onium cation include diphenyliodonium, 4-methoxydiphenyliodonium, bis(4-methylphenyl)iodonium, bis(4-tert-butylphenyl)iodonium, bis(dodecylphenyl) iodonium, triphenylsulfonium, diphenyl-4-thiophenoxyphenylsulfonium, bis[4-(diphenylsulfonio)-phenyl]sulfide, bis[4-(di(4-(2-hydroxyethyl)phenyl)sulfonio)-phenyl]sulfide, and η5-2,4-(cyclopentadienyl)[1,2,3,4,5,6-η-(methylethyl)benzene]-iron (1+). In addition, a perchlorate ion, a trifluoromethanesulfonate ion, a toluenesulfonate ion, a trinitrotoluenesulfonate ion, and the like can be mentioned in addition to the onium cation.

On the other hand, examples of the counter anion include tetrafluoroborate, hexafluorophosphate, hexafluoroantimonate, hexafluoroarsenate, hexachloroantimonate, tetra(fluorophenyl)borate, tetra(difluorophenyl)borate, tetra(trifluorophenyl)borate, tetra(tetrafluorophenyl)borate, tetra(pentafluorophenyl)borate, tetra(perfluorophenyl)borate, tetra(trifluoromethylphenyl)borate, and tetra(di(trifluoromethyl)phenyl)borate.

Specific examples of the more preferably used photocationic initiator include IRGACURE 250 (manufactured by Ciba Specialty Chemicals Corporation), IRGACURE 784 (manufactured by Ciba Specialty Chemicals Corporation), IRGACURE 290 (manufactured by BASF Japan Ltd.), ESACURE-1064 (manufactured by Lamberti S.p.A.), CYRAURE UVI6990 (manufactured by Union Carbide Japan K.K.), ADEKA OPTOMER SP-172 (manufactured by Adeka Corporation), ADEKA OPTOMER SP-170 (manufactured by Adeka Corporation), ADEKA OPTOMER SP-152 (manufactured by Adeka Corporation), ADEKA OPTOMER SP-150 (manufactured by Adeka Corporation), CPI-400 (manufactured by San-Apro Ltd.), CPI-310B (manufactured by San-Apro Ltd.), CPI-210K (manufactured by San-Apro Ltd.), CPI-210S (manufactured by San-Apro Ltd.), and CPI-100P (manufactured by San-Apro Ltd.).

In a case where the photocurable composition of the present embodiment includes a photocuring initiator, the photocurable composition may include only one type of photocuring initiator or may include two or more types of photocuring initiators.

The content of the photocuring initiator in the photocurable composition is preferably 0.1% to 20% by mass and more preferably 1.0% to 15% by mass based on the entire photocurable composition (100% by mass).

Sensitizer

The photocurable composition of the present embodiment may include a sensitizer.

Examples of the sensitizer include anthracene, naphthalene, phenothiazene, perylene, thioxanthone, and benzophenone thioxanthone. Further, examples of a sensitizing dye include a thiopyrylium salt-based dye, a merocyanine-based dye, a quinoline-based dye, a styryl quinoline-based dye, a ketocoumarin-based dye, a thioxanthene-based dye, a xanthene-based dye, an oxonol-based dye, a cyanine-based dye, a rhodamine-based dye, and a pyrylium salt-based dye. The sensitizer is preferably an anthracene-based sensitizer or a naphthalene-based sensitizer, and in a case of being used in combination with a cationic curing initiator (cationic polymerization initiator), the sensitivity is dramatically improved. Specific examples of anthracene-based and naphthalene-based compounds include dibutoxyanthracene, die thoxyanthracene, dipropoxyanthraquinone, bis(octanoyloxy)anthracene, and diethoxynaphthalene.

In a case where the sensitizer is used, the amount of the sensitizer added is preferably 0.01% by mass to 20% by mass, more preferably 0.01% by mass to 10% by mass, and still more preferably 0.01% by mass to 10% by mass based on the entire photocurable composition (100%) of the present embodiment. A plurality of sensitizers may be used in combination.

Other Components

The photocurable composition of the present embodiment may include components other than the above-mentioned components.

For example, the photocurable composition of the present embodiment may include a modifier such as a solvent, an anti-aging agent, a leveling agent, a wettability improver, a surfactant, or a plasticizer; a stabilizer such as a UV absorber, a preservative, or an antibacterial agent; a photosensitizer, a silane coupling agent, and the like. For example, the plasticizer is preferable because it may be useful for adjusting the viscosity in addition to the above-mentioned desired effects.

Physical Properties of Photocurable Composition after Light Irradiation Curing

In the nanoimprint process, for example, a process is carried out in which a concave-convex surface of a replica mold made of a photocurable composition (first photocurable composition) is brought into contact with a second photocurable composition used for processing a substrate to be processed, and UV irradiation is carried out while applying a pressure to cure the second photocurable composition which is then peeled off to form a concave-convex structure on the surface of the substrate to be processed. In this process, conventionally, particularly in a case where the replica mold is repeatedly used, defects that hinder the repeated use of the replica mold, such as resin adhesion to the surface of the replica mold and shape destruction of the concave-convex structure due to external stress, occur.

The present inventors have conducted extensive studies on the relationship between these defects and the physical properties of the resin after curing. As a result, the present inventors have found that, in a case where the above photocurable composition is used and the surface free energy and resin hardness of the resin surface after photocuring are within the range which will be described later, the replica mold can easily maintain an initial state thereof even in a case where the replica mold is repeatedly used, and good processing of the substrate to be processed can be realized.

Hereinafter, the surface free energy and the resin hardness will be specifically described.

i) With Regard to Surface Free Energy

In the nanoimprint method using a replica mold, it is considered that the resin adhesion to the surface of the replica mold is realized by designing the surface energy of the replica mold to be appropriately low.

Usually, a contact angle method using water droplets is generally used as a method for knowing the surface state such as surface energy. Typically, a surface of a base material treated with a fluororesin repels water droplets, and an angle (contact angle) between the base material surface and the water droplets exceeds 100°.

On the other hand, on the surface of a base material made of a material modified with a group that is easily compatible with water, such as a hydroxyl group, the contact angle of water is as small as several to several tens of degrees. However, in the method of evaluating the surface state of the base material by the contact angle of water, although it is possible to make a qualitative evaluation to know the intermolecular force caused by the hydrogen bonding strength, it is not possible to evaluate various forces acting between the two substances (between the replica mold and the second photocurable composition), specifically hydrogen bonding strength, dispersion force, orientation force, induction force, and the like.

The present inventors have found that, even in a case where the materials have the same contact angle of water, the resin adhesiveness in a case of being made into a replica mold may be different therebetween. As a result of further studies based on this finding, the present inventors have thought that the contact angle of water is just an index showing the relationship with water, and it is usually difficult to determine the compatibility between the replica mold, which is an organic compound, and the second photocurable composition. Consequently, the present inventors have found that the free energy of the resin film surface after photocuring (hereinafter, also simply referred to as surface free energy) and the degree of resin adhesion in a case of using the replica mold are moderately correlated therebetween as another evaluation method.

More specifically, in a case where the surface free energy expressed as a sum of the hydrogen bonding strength, dispersion force, orientation force, and induction force acting on the surface of the resin film (replica mold) after photocuring is smaller than a specific value, the residue of the second photocurable composition is unlikely to remain on the fine concave-convex structure on the surface of the replica mold in a case where the second photocurable composition is applied onto or photocured on the surface of the replica mold, or peeled off therefrom. On the other hand, in a case where the surface free energy exceeds a specific value, the residue of the second photocurable composition tends to adhere to the replica mold, the replica mold tends to deteriorate, and therefore the replica mold cannot be used repeatedly. The term "adhesion" as used herein means that the deterioration of the surface of the replica mold after use thereof can be visually confirmed in a case where it is significant (more specifically, the degree of adhesion of the second photocurable composition can be known by observation with an optical microscope, SEM, or the like).

Quantitatively, the surface free energy of the resin film after photocuring, which is measured as in the following evaluation method 1, is preferably 15 mJ/m$^2$ to 40 mJ/m$^2$, more preferably 15 mJ/m$^2$ to 38 mJ/m$^2$, and still more preferably 15 mJ/m$^2$ to 35 mJ/m$^2$.

In a case where the surface free energy is larger than 40 mJ/m$^2$, the second photocurable composition after light irradiation curing adheres to the replica mold, as described above. In addition, in a case where the surface free energy is smaller than 15 mJ/m$^2$, the compatibility with the replica mold at the time of application is poor, and the second photocurable composition tends to be repelled on the surface of the replica mold. Then, in a case where the second photocurable composition is pressed against the replica mold as it is, irradiated with light, and peeled off from the replica mold, for example, voids derived from bubbles that have lost their escape area may be generated.

Evaluation Method 1

First, a photocurable composition is coated on a substrate to form a photocurable film, which is then irradiated with ultraviolet rays to obtain a cured film.

Next, contact angles of water, diiodomethane, and 1-bromonaphthalene with respect to the cured film are measured using a contact angle meter.

Then, the surface free energy is calculated from the Kitazaki-Hata theory.

Incidentally, in order to sufficiently (substantially completely) cure the photocurable film, a sufficient amount of light, for example, an ultraviolet ray having an integrated light amount of 2000 mJ/cm$^2$ is irradiated. Irradiation can be carried out with UV light (LED light source) having a wavelength of 365 nm or the like. In addition, the thickness of the photocurable film in the evaluation method 1 is, for example, about 5 to 6 μm (5.5±0.5 μm).

The calculation of the surface free energy based on the Kitazaki-Hata theory can be carried out by software or the like attached to a commercially available contact angle meter. As a means of precaution, the Kitazaki-Hata theory will be described below.

Assuming that the surface free energy of the cured film to be measured is defined as A, and components of the surface free energy A are defined as a component ($A_d$) belonging to the dispersion force, a component ($A_p$) belonging to the orientation (polarity) force, and a component ($A_h$) belonging to the hydrogen bonding strength, A is expressed by Equation (1). (Since the intermolecular force caused by the induction force in the above explanation is extremely small, it is ignored in the calculation.)

$$A = A_d + A_p + A_h \qquad \text{Equation (1)}$$

In addition, assuming that the surface free energy of liquid 1 whose value of each component is known is defined as $B_1$, and components of the surface free energy $B_1$ are defined as a component ($B_{1d}$) belonging to the dispersion force, a component ($B_{1p}$) belonging to the orientation (polarity) force, and a component ($B_{1h}$) belonging to the hydrogen bonding strength, $B_1$ is expressed by Equation (2).

$$B_1 = B_{1d} + B_{1p} + B_{1h} \qquad \text{Equation (2)}$$

Similarly, assuming that the surface free energy of liquid 2 whose value of each component is known is defined as $B_2$ and the surface free energy of liquid 3 whose value of each component is known is defined as $B_3$, $B_2$ and $B_3$ are expressed by Equation (3) and Equation (4), respectively.

$$B_2 = B_{2d} + B_{2p} + B_{2h} \qquad \text{Equation (3)}$$

$$B_3 = B_{3d} + B_{3p} + B_{3h} \qquad \text{Equation (4)}$$

Further, assuming that the contact angle measured using the cured film to be measured and the liquid 1 is defined as $\theta_1$, the contact angle between the cured film to be measured and the liquid 2 is defined as $\theta_2$, and the contact angle between the cured film to be measured and the liquid 3 is defined as $\theta_3$, the relationships of Equation (5), Equation (6), and Equation (7) are established for each component of the surface free energies of the cured film to be measured, the liquid 1, the liquid 2 and the liquid 3 and the value of the contact angle.

$$\sqrt{A_d \cdot B_{1d}} + \sqrt{A_p \cdot B_{1p}} + \sqrt{A_h \cdot B_{1h}} = \frac{B_1(1+\cos\theta_1)}{2} \qquad \text{Equation (5)}$$

$$\sqrt{A_d \cdot B_{2d}} + \sqrt{A_p \cdot B_{2p}} + \sqrt{A_h \cdot B_{2h}} = \frac{B_2(1+\cos\theta_2)}{2} \qquad \text{Equation (6)}$$

$$\sqrt{A_d \cdot B_{3d}} + \sqrt{A_p \cdot B_{3p}} + \sqrt{A_h \cdot B_{3h}} = \frac{B_3(1+\cos\theta_3)}{2} \qquad \text{Equation (7)}$$

$A_d$, $A_p$, and $A_h$ are calculated by solving simultaneous three-dimensional linear equations consisting of Equation (5), Equation (6), and Equation (7). Then, the surface free energy A of the cured film is calculated from Equation (1).

ii) With Regard to Resin Hardness

As a defective mode in a case where a replica mold is repeatedly used, the collapse of the concave-convex structure on the surface of the replica mold caused by the pressing process or the like can be mentioned in addition to the resin adhesion described above. For example, a line breakage or a line edge chipping is shown in a case of a line-and-space shape. In addition, a defect such as a broken pillar is shown in a case of a pillar shape.

Usually, the resin hardness is expressed by the degree of scratches in a scratch test or the pencil hardness which is expressed by the hardness of a pencil in a case of being scratched with a specified pencil. However, these methods can be adapted to, for example, bulk evaluation of a flat surface, but cannot be adapted to evaluation for determining shape retention of a fine concave-convex structure.

The present inventors have found that the hardness obtained by a nanoindentation method, in which the film surface is directly pressed with an indenter shaped like a very fine needle, and the resin hardness is defined by the repulsive force at that time, is an index that suitably represents the relationship between the shape retention of the replica mold and the resin hardness.

Specifically, the hardness of the photocurable composition after photocuring, which is measured as in the following evaluation method 2, is preferably 0.05 GPa to 0.5 GPa, more preferably 0.1 GPa to 0.5 GPa, and still more preferably 0.15 GPa to 0.5 GPa. In a case where the hardness of the photocurable composition after photocuring exceeds an upper limit value, the resin surface becomes hard and brittle, the concave-convex shape cannot be maintained even with a minute external stress, and the resin surface cannot withstand the bending rate of the roll in a case of being used in a roll-to-roll process, resulting in cracks in the concave-convex shape. Further, in a case where the hardness of the photocurable composition after photocuring is smaller than a lower limit value, the resin is soft, the resin may be deformed by the stress in a case where it is brought into contact with the second photocurable composition and pressed, for example, causing a shape change to the T-top, and peeling may not be possible due to an anchor effect.

Evaluation Method 2

First, a cured film is obtained in the same manner as in the evaluation method 1 described above.

Next, using a nanoindenter, a Berkovich indenter is pressed against the cured film, and the hardness thereof is calculated from a value of the detected stress.

Concave and Convex Structure and Production Method Thereof

A concave-convex structure (for example, a replica mold) including a substrate and a resin layer provided on the substrate and having fine concavities and convexities formed on a surface thereof can be produced using the photocurable composition of the present embodiment.

Hereinafter, a specific aspect and a production method of the substrate will be specifically described.

With Regard to Substrate

The material of the substrate is not particularly limited. The substrate is constituted of, for example, an organic material or an inorganic material. In addition, as for the properties of the substrate, for example, a sheet-like, film-like, plate-like, or porous substrate can be used.

More specifically, in a case where the substrate is constituted of an organic material, for example, one or more of various resins such as polyester (such as polyacetal, polyamide, polycarbonate, polyphenylene ether, polybutylene terephthalate, polyethylene terephthalate, or polyethylene terenaphthalate), polyolefin (such as polyethylene or polypropylene), poly(meth)acrylate, polysulfone, polyethersulfone, polyphenylenesulfide, polyetheretherketone, polyimide, polyetherimide, polyacetylcellulose, polyvinyl alcohol, polyurethane, and a fluororesin (such as polyvinylidene fluoride, polytetrafluoroethylene, a hexafluoropropylene-tetrafluoroethylene copolymer, or a perfluoropropyl vinyl ether-tetrafluoroethylene copolymer) can be used as a raw material. Then, the substrate can be obtained by processing the raw material by a method such as injection molding, extrusion molding, hollow molding, thermoforming, or compression molding. In addition, examples of the porous substrate include one that has been cured in a state of being made porous with a foaming agent, one that has been made porous by stretching a non-porous base material, one that has been made porous by laser processing, and a non-woven fabric having a porous structure between fibers.

In another aspect, the substrate may be a single-layer substrate obtained by curing a photocurable monomer such as (meth)acrylate, styrene, epoxy, or oxetane by light irradiation in the presence of a polymerization initiator, or a substrate obtained by coating such a photocurable monomer on an organic material or an inorganic material.

In a case where the substrate is constituted of an inorganic material, examples of the constituent material thereof include copper, gold, platinum, nickel, aluminum, silicon, stainless steel, quartz, soda glass, sapphire, and carbon fiber.

Regardless of whether the constituent material of the substrate is an organic material or an inorganic material, some treatment may be carried out on the surface of the substrate in order to develop good adhesiveness to a photocurable composition and a cured product thereof. Examples of such a treatment include close contact treatments such as a corona treatment, an atmospheric pressure plasma treatment, a vacuum plasma treatment, and an easy adhesion coating treatment.

In addition, regardless of whether the constituent material of the substrate is an organic material or an inorganic material, the substrate may be of a single layer or may have a configuration of two or more layers.

The substrate is preferably a resin film. The substrate is preferably, for example, a resin film containing any of the above-mentioned resins. Since the substrate is not an inorganic material but a resin film, the user can easily cut the resin film into a desired shape and size and then use the cut resin film. In addition, a laminate can be rolled in a case of storing the laminate. That is, there is an advantage of space saving.

From another viewpoint, it is preferable that the light transmittance of the substrate is high. Thereby, advantages can be obtained such that, in a case where a replica mold is produced or used, (i) light can be applied from the side of the substrate to accelerate a curing reaction in a case where a concave-convex structure is produced, (ii) various steps can be easily confirmed visually, and (iii) it is easy to freely design the direction of light irradiation and therefore the degree of freedom in device design can be increased.

From the viewpoint of (i), it may be preferable that the substrate has a high transmittance in a wavelength region of light with which the photocuring initiator described above reacts. More preferably, the substrate preferably has a high transmittance of light in the ultraviolet region. For example, the transmittance of light having a wavelength of 200 nm to 400 nm is preferably 50% to 100%, more preferably 70% to 100%, and still more preferably 80% to 100%.

From the viewpoint of (ii), it is preferable that the transmittance of light in the visible region of the substrate is high. For example, the transmittance of light having a wavelength of 500 nm to 1000 nm is preferably 50% to 100%, more preferably 70% to 100%, and still more preferably 80% to 100%.

In addition, since most of the resin films have high transparency, it can be said that the resin film is preferable as the substrate also in terms of light transmittance.

The thickness of the substrate is not particularly limited. The thickness of the substrate is appropriately adjusted according to various purposes, for example, good handleability of the laminate, dimensional accuracy of the concave-convex structure to be obtained, and the like.

The thickness of the substrate is, for example, 1 μm to 10000 μm, specifically 5 μm to 5000 μm, and more specifically 10 μm to 1000 μm.

The shape of the entire substrate is not particularly limited. For example, the substrate may be plate-shaped, disk-shaped, roll-shaped, or the like.

With Regard to Coating Step

The specific procedure of the method for producing the concave-convex structure of the present embodiment is not particularly limited. For example, the concave-convex structure of the present embodiment can be produced by a step including a step of forming a photocurable composition layer (photocurable layer forming step) using the photocurable composition of the present embodiment on a surface of a substrate.

The specific method of the step of forming the photocurable composition layer is not particularly limited. Typically, first, a photocurable composition is applied onto a substrate by the following coating method to form a photocurable layer.

A known method can be applied to the coating method. Examples of the known coating method include a table coating method, a spin coating method, a dip coating method, a die coating method, a spray coating method, a bar coating method, a roll coating method, a curtain flow coating method, a slit coating method, a knife coating method, an inkjet coating method, and a dispensing method. These coating methods are appropriately selected in consideration of the shape and size of fine concavities and convexities, the size as a replica mold, productivity, and the like.

In addition, in a case where the photocurable composition includes a solvent, a baking (heating) step may be provided after the application, if necessary, for the purpose of removing the solvent. Various conditions such as baking temperature and time may be appropriately set in consideration of coating thickness, process mode, and productivity. The baking temperature and time are selected in a temperature range of preferably 20° C. to 200° C., more preferably 20° C. to 180° C. for a time of preferably 0.5 to 30 minutes, more preferably 0.5 to 20 minutes.

The baking method may be any method such as directly heating with a heating plate or the like, passing through a hot air stove, or using an infrared heater.

The thickness of the photocurable layer provided on the substrate is in a range of preferably 0.05 μm to 100 μm, more preferably 0.10 μm to 80 μm, and still more preferably 0.20 μm to 50 μm. By setting the thickness of the photocurable layer within the above range, the photocurable composition can be effectively photocured at the time of producing a replica mold. In addition, for example, in a case where a roll-to-roll process is taken into consideration, the photocurable composition can be used in a good state without cracks even in a case where bending stress corresponding to the bending ratio of a roll around which the replica mold is wound is applied.

With Regard to Pressing Step

The concave-convex surface of a mold having a concave-convex structure on a surface thereof is pressed against the photocurable layer formed on the substrate by the above-mentioned method. As a result, a concave-convex pattern corresponding to the concave-convex surface of the mold is transferred to the photocurable layer. Incidentally, the mold here is a mold designed according to the concave-convex processing of a substrate to be processed, and specifically, a mother mold.

The shape of the mold (mother mold) is not particularly limited. Examples of the shape of a convex portion and a concave portion of the mold include a dome shape, a quadrangular prism shape, a column shape, a prism shape, a quadrangular pyramid shape, a triangular pyramid shape, a polyhedral shape, and a hemispherical shape.

Examples of the cross-sectional shape of the convex portion and the concave portion of the mold include a quadrangular cross section, a triangular cross section, and a semicircular cross section.

The width of the convex portion and/or the concave portion of the mold (mother mold) is not particularly limited, but is, for example, 10 nm to 100 μm and preferably 20 nm to 70 μm. In addition, the depth of the concave portion and/or the height of the convex portion is not particularly limited, but is, for example, 10 nm to 100 μm and preferably 20 nm to 70 μm. Further, the aspect ratio of the ratio of the width of the convex portion to the height of the convex portion is preferably 0.1 to 500 and more preferably 0.5 to 20.

Examples of the material of the mold (mother mold) include a metal material such as nickel, iron, stainless steel, germanium, titanium, or silicon; an inorganic material such as glass, quartz, or alumina; a resin material such as polyimide, polyamide, polyester, polycarbonate, polyphenylene ether, polyphenylene sulfide, polyacrylate, polymethacrylate, polyarylate, epoxy resin, or silicone resin; and a carbon material such as diamond or graphite.

The method of pressing can be carried out by a known method. For example, a method of pressing the photocurable composition layer in contact with the concave-convex pattern of the mold with an appropriate pressure can be mentioned.

The upper limit of the pressure is not particularly limited. The upper limit of the pressure is, for example, preferably 10 MPa or less, more preferably 5 MPa or less, and particularly preferably 1 MPa or less. This pressure is appropriately selected depending on the pattern shape, aspect ratio, material, and the like of the mold. There is no particular lower limit of the pressure. The photocurable composition layer may be filled in every corner corresponding to the concave-convex pattern of the mold. The upper limit of the pressure is, for example, 0.1 MPa or more.

The pressing step may be carried out in the atmosphere or may be carried out in a vacuum, an inert gas such as nitrogen gas, or further in a fluorine gas atmosphere. The atmosphere in which the pressing step is carried out is selected in a timely manner according to the purpose, such as curability of the photocurable composition, deaeration such as bleeding air, and increasing the filling speed of the photocurable composition.

Light Irradiation Step

In the light irradiation step, the photocurable layer is irradiated with light. More specifically, the photocurable layer is irradiated with light while the pressure is still applied in the pressing step (while the mold is pressed against). Then, the photocurable layer is cured.

The light to be irradiated is not particularly limited as long as it is capable of curing the photocurable composition layer. Specific examples thereof include ultraviolet light, visible light, and infrared light. Of these, light that generates radicals or ions from the photocuring initiator is preferable.

Specifically, a light source that generates a light beam having a wavelength of 400 nm or less, for example, a low pressure mercury lamp, a medium pressure mercury lamp, a high pressure mercury lamp, an ultra-high pressure mercury lamp, a chemical lamp, a black light lamp, a microwave excitation mercury lamp, a metal halide lamp, an i-line, a g-line, a KrF excimer laser light, or an ArF excimer laser light can be used as a light source.

The integrated light amount of light irradiation can be set to, for example, 3 mJ/cm$^2$ to 10000 mJ/cm$^2$.

The light irradiation may be carried out from any direction of either the back surface of the substrate on which the photocurable composition layer is formed or the opposite surface of the surface on which the concave-convex structure of the mold (mother mold) is formed. In particular, the direction of light irradiation may be selected in a timely manner in consideration of the material (light transmittance and the like) of the substrate and the mold.

Light irradiation and heating may be carried out in combination for the purpose of accelerating the curing of the photocurable composition layer and the like. Alternatively, the heating step may be carried out after the light irradiation step.

The heating temperature is preferably equal to or higher than room temperature (usually meaning 25° C.) and equal to or lower than 200° C. and more preferably equal to or higher than room temperature and equal to or lower than 150° C. The heating temperature may be appropriately selected in consideration of the heat resistance of the substrate, the photocurable composition layer and the mold, the improvement of productivity by promoting the curing, and the like.

With Regard to Peeling Step

The method for producing a concave-convex structure of the present embodiment preferably includes a mold peeling step. Specifically, the photocurable layer cured by the light irradiation step is separated from the mold to obtain a concave-convex structure in which a concave-convex pattern is formed on a substrate.

A known method can be applied to the method of peeling a mold.

For example, the resin layer formed on the substrate and the mold can be peeled off from the end portion of the substrate as a starting point. Alternatively, an adhesive tape may be attached to the substrate, and the resin layer formed on the substrate and the mold may be separated from the tape as a starting point. Furthermore, in a case where it is carried out by a continuous method such as a roll-to-roll process, a method may be used in which a roll is rotated at a speed corresponding to the peripheral speed of the step while the resin layer formed on the substrate and the concave-convex structure having a concave-convex pattern formed therein are peeled off while being wound up.

A concave-convex structure in which the concavities and convexities of the mold (mother mold) are inverted can be produced through the foregoing steps.

Method for Using Replica Mold

The method for using a replica mold is not particularly limited. For example, the replica mold can be used in the same manner as in the above-mentioned method for producing a replica mold. In this case, the mold called a mother mold is read as a mold (replica mold) having a concave-convex structure on a surface thereof, which is obtained by curing the photocurable composition (first photocurable composition) of the present embodiment. In addition, a material having characteristics according to the processing method of a substrate to be processed and various uses (for example, etching resistance, transparency, hardness, and gas permeability) is selected as the photocurable composition (second photocurable composition).

Further, the replica mold made of the photocurable composition of the present invention can be repeatedly used with the same material (first photocurable composition). For example, 50 replica molds are produced from the replica mold with the first photocurable composition, and 100 substrates are processed with the second photocurable composition in individual replica molds. This makes it possible to process 5000 sheets (50×100) of substrates, and therefore it is possible to achieve efficient production of products while preventing deterioration of the replica mold.

Regarding the processing of a substrate to be processed, for example, in a case where circuit formation is described as an example, a method of forming a groove for embedding copper on the surface of a silicon wafer can be exemplified. Specifically, it is as follows.

First, a photocurable composition having etching resistance is applied onto a silicon wafer by a method such as spin coating, the replica mold of the present invention is pressed against thereto, and the photocurable composition is cured by light irradiation and then peeled off. Next, using the concave-convex structure formed on the silicon wafer as a mask, the surface of the silicon wafer is processed by a dry etching method to form a concave-convex structure. Then, copper is embedded to complete a circuit.

In a case where the replica mold can be used repeatedly in such a process, the number or area of substrates to be processed that can be processed from one replica mold can be increased, and therefore the productivity can be improved.

In short, a substrate having a resin layer having fine concavities and convexities formed on a surface thereof, which is formed of the photocurable composition of the present embodiment, is repeatedly used as a replica mold to form a fine concave-convex pattern, thus making it possible to increase the productivity of nanoimprinting. That is, using the photocurable composition of the present embodiment makes it possible to realize an industrially highly productive UV nanoimprint process.

In addition, as the present inventors have found, the photocurable composition of the present embodiment is characterized by having a wide range of adaptation of pattern shapes from nano size to micro size. Accordingly, the photocurable composition of the present embodiment is preferably applied not only to the use of the replica mold but also to the use other than the replica mold (various fine concave-convex patterns can be satisfactorily formed with one photocurable composition).

Although the embodiments of the present invention have been described hereinbefore, these embodiments are examples of the present invention and various configurations other than the foregoing embodiments can be adopted. In addition, the present invention is not limited to the foregoing embodiments, and modifications, improvements, and the like within the range in which the object of the present invention can be achieved are also encompassed by the present invention.

EXAMPLES

Embodiments of the present invention will be described with reference to Examples. The present invention is not limited to the Examples.

First, the following will be described.

Analysis method for commercially available products and synthetic photocurable additives and binder resins Surface free energy measurement method (evaluation method 1) and hardness measurement method (evaluation method 2)

Molds, devices, evaluation/analysis methods, and the like used in nanoimprint process

Weight Average Molecular Weight (Mw) and Molecular Weight Distribution (Mw/Mn)

The molecular weights of the commercially available products which will be described later and the additives shown in Synthesis Examples were measured by gel permeation chromatography (GPC). Specifically, the weight average molecular weight (Mw) and the number average molecular weight (Mn) of the polymer dissolved in tetrahydrofuran (THF) were measured by calibrating the molecular weights with a polystyrene standard under the following conditions.

Detector: RI-2031 and 875-UV (manufactured by JASCO Corporation)

Columns connected in series: Shodex K-806M, 804, 803, 802.5

Column temperature: 40° C.

Flow rate: 1.0 ml/min

Sample concentration: 3.0 to 9.0 mg/mL

Hydrogenation Rate of Fluorine-Containing Cyclic Olefin Polymer

The powder of an additive subjected to a hydrogenation reaction was dissolved in deuterated tetrahydrofuran. By 270 MHz-$^1$H-NMR measurement, an integral value of the signal of hydrogen bonded to the double bond carbon of a main chain in the region of $\delta$=4.5 to 7.0 ppm was obtained, and a hydrogenation rate was calculated from this integral value.

In a case where no signal of hydrogen derived from the double bond of the main chain was observed in the region of $\delta$=4.5 to 7.0 ppm, the hydrogenation rate was set to 100%.

Evaluation Method 1: Surface Free Energy Measurement Method

A film of a photocurable composition was formed on a PET film substrate (LUMIRROR U34, thickness: 188 µm, manufactured by Toray Industries, Inc.) using a bar coater. This was followed by a drying treatment on a hot plate at 100° C. for 1 minute in a case where the photocurable composition included a solvent. As a result, a photocurable film was formed.

Next, UV light (LED light source) having a wavelength of 365 nm was irradiated with an integrated light amount of 2000 mJ/cm$^2$ to cure the photocurable film, and a surface-uniform sample for surface free energy measurement having a thickness of 5 to 6 µm was produced.

The contact angle on the sample surface was measured using a contact angle meter (Model A-XE, manufactured by Kyowa Interface Science Co., Ltd.) and using water, diiodomethane, and 1-bromonaphthalene as standard test solutions.

The surface free energy was calculated by a calculation method based on the above-mentioned Kitazaki-Hata theory, using the known surface free energy of the standard test solution and the measured value of the contact angle of the standard test solution on a test subject. Specifically, the multifunctional integrated analysis software FAMAS (manufactured by Kyowa Interface Science Co., Ltd.), which is application software attached to the contact angle meter, was used for the calculation.

The numerical values described in Examples are average values of the results of carrying out the same test 5 times for one sample.

Evaluation Method 2: Hardness Measurement Method

First, a photocurable film was formed and irradiated with light in the same manner as in the evaluation method 1 to obtain a cured film of a photocurable composition.

Next, using a nanoindenter (TI-950 Tribo Indenter, manufactured by Hysitron Inc.), the resin hardness was measured by an indentation test conforming to ISO 14577, which is a standard of the nanoindentation method. A Berkovich type indenter was pressed against the cured film to a depth of 200 nm, and the hardness (GPa) under room temperature conditions of 23° C. to 25° C. was calculated from the detected stress value.

The numerical values described in Examples are average values of the results of carrying out the same test 5 times for one sample.

Mold Used (Equivalent to Mother Mold)

A quartz mold with a line (convex portion)-and-space (concave portion) pattern was used.

Specifically, the following molds A and B were used in a case where the width of the convex portion was defined as L1, the width of the concave portion was defined as L2, and the height of the convex portion was defined as L3.

Mold A: L1=450 nm, L2=450 nm, L3=450 nm

Mold B: L1=75 nm, L2=75 nm, L3=150 nm

Device Used for Producing Concave-Convex Structure

A UV nanoimprint device X-100U (manufactured by SCIVAX Corporation) was used for pressing the photocurable composition (photocurable film) and the mold, and subsequent UV irradiation. The UV light source is a UV-LED light source having a wavelength of 365 nm.

Dimensional Measurement of Convex Portion

A scanning electron microscope JSM-6701F (manufactured by JASCO Corporation, hereinafter referred to as SEM) was used for the dimensional measurement of the concave-convex structure. For the measurement of the convex portion width, line widths at any five points on the pattern surface were measured, and an average value of the obtained five values was adopted as the convex portion width.

Dimensional Evaluation of Convex Portion in Case of being Repeatedly Used as Replica Mold In order to evaluate the deterioration of the mold due to repeated use, the convex portion width of the replica mold after use thereof was measured by SEM at the time of mold production, after single use, and after every 10 uses. Table 2 which will be given later shows the measured values of the convex portion width after 50 times of use unless otherwise specified.

Hereinafter, a method for synthesizing an additive having a photoreactive functional group and a binder resin, a method for preparing a photocurable composition, and an evaluation result will be described.

Synthesis Example 1

Synthesis of Additive (C-1)

First, a tetrahydrofuran solution of 5,5,6-trifluoro-6-(trifluoromethyl)bicyclo[2.2.1]hept-2-ene (100 g) as fluorine-containing cyclic olefin monomer and 1,2-epoxy-5-hexene (5.675 g) was prepared. A tetrahydrofuran solution of Mo(N-2,6-Pr$^i_2$C$_6$H$_3$)(CHCMe$_2$Ph)(OBut)$_2$ (85 mg) was added thereto, and ring-opening metathesis polymerization was carried out at 70° C.

Next, the olefin portion of the obtained polymer was subjected to a hydrogenation reaction using a solid catalyst palladium alumina (5 g) under the conditions of 160° C. for 24 hours to hydrogenate the olefin in the main chain.

The palladium alumina was removed by pressurizing the obtained solution with a filter having a pore size of 0.5 μm. The obtained solution was discharged into a mixed solution of methanol/hexane (50% by mass/50% by mass), and a white polymer was filtered off and dried.

As a result, 95 g of a white powdery polymer (additive (C-1)) was obtained.

From $^1$H-NMR, the hydrogenation rate of the additive (C-1) was 100%, and in the structure represented by General Formula (2), L$_2$ contained a hydroxyl group-containing aliphatic structure in which an epoxy group was reduced by hydrogen. The additive (C-1) had a weight average molecular weight (Mw) of 6050 and a molecular weight distribution (Mw/Mn) of 1.49.

Synthesis Example 2

Synthesis of Additive (C-2)

First, ring-opening metathesis polymerization was carried out in the same manner as in Synthesis Example 1, except that the type of monomer was changed to 5,6-difluoro-5-trifluoromethyl-6-perfluoroethylbicyclo[2.2.1]hept-2-ene.

Next, the olefin portion of the obtained polymer was subjected to a hydrogenation reaction using a homogeneous catalyst (Ph$_3$P)$_3$CORuHCl under the conditions of 125° C. for 24 hours to hydrogenate the olefin in the main chain.

Then, the obtained solution was discharged into methanol, and a white polymer was filtered off and dried to obtain 98 g of a white powdery polymer (additive (C-2)).

From $^1$H-NMR, the hydrogenation rate of the additive (C-2) was 100%, and in the structure represented by General Formula (2), L$_2$ contained an epoxy group-containing aliphatic structure. The additive (C-2) had a weight average molecular weight (Mw) of 6200 and a molecular weight distribution (Mw/Mn) of 1.51.

Synthesis Example 3

Synthesis of Binder Resin (B-1)

First, a tetrahydrofuran solution of 5,5,6-trifluoro-6-(trifluoromethyl)bicyclo[2.2.1]hept-2-ene (100 g) and 1-hexene (0.298 mg) was prepared. A tetrahydrofuran solution of Mo(N-2,6-Pr$^i_2$C$_6$H$_3$)(CHCMe$_2$Ph)(OBut)$_2$ (50 mg) was added thereto, and ring-opening metathesis polymerization was carried out at 70° C.

Next, the olefin portion of the obtained polymer was subjected to a hydrogenation reaction by palladium alumina (5 g) at 160° C. to obtain a tetrahydrofuran solution of poly(1,1,2-trifluoro-2-trifluoromethyl-3,5-cyclopentylene-ethylene). The palladium alumina was removed by pressurizing the obtained solution with a filter having a pore size of 5 μm.

Then, the obtained solution was added to methanol, and a white polymer was filtered off and dried. As a result, 99 g of a binder resin (B-1), which is a fluorine-containing cyclic olefin polymer having no reactive functional group, was obtained. The binder resin (B-1) had a hydrogenation rate of 100%, a weight average molecular weight (Mw) of 70000, and a molecular weight distribution (Mw/Mn) of 1.71.

Example 1

Preparation of Photocurable Composition (1), Production of Replica Mold, and the Like First, a solution was prepared in which 0.05 g of X-22-2000 (manufactured by Shin-Etsu Silicone Co., Ltd.) as an additive and 1 g of CPI-310B (manufactured by San-Apro Ltd.) as a photocuring initiator were added to 10 g of a mixture of bis(3-ethyl-3-oxetanylmethyl)ether and 3,4-epoxycyclohexylmethyl-3',4'-epoxycyclohexanecarboxylate in a mass ratio of 7/3 as a photocurable monomer.

(X-22-2000 represents R$_1$=methyl group, L$_1$=epoxy group, methyl group, and phenyl group in General Formula (1), and has a molecular weight (Mw) of 7300.)

Next, this solution was pressure-filtered with a filter having a pore size of 1 μm, and further filtered through a filter having a pore size of 0.1 μm. As described above, a photocurable composition (1) was prepared.

Using the obtained photocurable composition (1), a resin film cured by an LED light source was produced and evaluated according to the evaluation method 1 and the evaluation method 2. The cured resin film had a surface free energy of 26.2 mJ/m$^2$ and a surface hardness of 0.28 GPa.

A film of the photocurable composition (1) was formed on a PET substrate in the same manner as in the evaluation method 1. Then, using the nanoimprint device described above, the atmospheric surface of the formed film was pressed at a pressure of 0.2 MPa gauge pressure against the mold A or the mold B, respectively. While maintaining the pressure applied state, the photocurable composition (1) was cured by irradiation with light at an integrated light amount of 2000 mJ/cm$^2$ from the back surface side of the PET film substrate.

The cured film formed on the PET film substrate was peeled off from the mold to obtain a replica mold A-1 (produced from the quartz mold A) or replica mold B-1 (produced from the quartz mold B) having a line-and-space structure on a surface thereof.

The convex portion width of the produced replica mold was measured by SEM. The replica mold A-1 had a convex portion width of 449 nm and the replica mold B-1 had a convex portion width of 74 nm.

Further, a cross section of the replica mold B-1 was cut out, and a state of elemental ions in the cross section was mapped by time-of-flight secondary ion mass spectrometry (TOF-SIMS). As a result, the cross-sectional state of two layers was observed, and negative ions of a silicon-containing fragment belonging to the additive X-22-2000 were detected on the atmospheric surface side of the two layers (shown in FIG. 1).

Example 2

Preparation of Photocurable Composition (2), Production of Replica Mold, and the Like A solution was prepared in which 0.5 g of the additive (C-1) synthesized in Synthesis Example 1 as an additive and 0.95 g of CPI-310B (manufactured by San-Apro Ltd.) as a photocuring initiator were added to 9.5 g of a mixture of bis(3-ethyl-3-oxetanylmethyl)ether and 3,4-epoxycyclohexylmethyl-3',4'-epoxycyclohexanecarboxylate in a mass ratio of 7/3 as a photocurable monomer.

Next, a photocurable composition (2) was prepared in the same manner as in Example 1.

Using the obtained photocurable composition (2), a resin film cured by an LED light source was produced and evaluated according to the evaluation method 1 and the evaluation method 2. The cured resin film had a surface free energy of 32.0 mJ/m$^2$ and a hardness of 0.22 GPa.

In addition, the replica mold A-2 and the replica mold B-2, produced in the same manner as in Example 1, had a convex portion width of 449 nm and a convex portion width of 73 nm, respectively.

Example 3

Preparation of Photocurable Composition (3), Production of Replica Mold, and the Like A photocurable composition (3) was prepared in the same manner as in Example 1, except that 0.1 g of X-22-2000 (manufactured by Shin-Etsu Silicone Co., Ltd.) and 0.05 g of the additive (C-1) were used as additives.

Using the obtained photocurable composition (3), a resin film cured by an LED light source was produced and evaluated according to the evaluation method 1 and the evaluation method 2. The cured resin film had a surface free energy of 36.8 mJ/m$^2$ and a hardness of 0.25 GPa.

In addition, the replica mold A-3 and the replica mold B-3, produced in the same manner as in Example 1, had a convex portion width of 450 nm and a convex portion width of 75 nm, respectively.

Example 4

Preparation of Photocurable Composition (4), Production of Replica Mold, and the Like A solution was prepared in which 0.1 g of BY16-876 (manufactured by Dow Corning Toray Co., Ltd.) and 0.05 g of the additive (C-1) as additives, 0.5 g of CPI-310B (manufactured by San-Apro Ltd.) as a photocuring initiator, and further 0.1 g of a sensitizer (ANTHRACURE UVS-1331, manufactured by Kawasaki Kasei Chemicals Ltd.) were added to 10 g of limonene dioxide as a photocurable monomer.

(BY16-876 represents $R_1$=methyl group, $L_1$=epoxy group, methyl group, and polyether group in General Formula (1), and has a molecular weight (Mw) of 25000.)

Next, a photocurable composition (4) was obtained in the same manner as in Example 1.

Using the obtained photocurable composition (4), a resin film cured by an LED light source was produced and evaluated according to the evaluation method 1 and the evaluation method 2. The cured resin film had a surface free energy of 33.2 mJ/m$^2$ and a hardness of 0.24 GPa.

In addition, the replica mold A-4 and the replica mold B-4, produced in the same manner as in Example 1, had a convex portion width of 448 nm and a convex portion width of 74 nm, respectively.

Example 5

Preparation of Photocurable Composition (5), Production of Replica Mold, and the Like A solution was prepared in which 2.5 g of the binder resin (B-1) synthesized in Synthesis Example 3, 0.05 g of X-22-2000 (manufactured by Shin-Etsu Silicone Co., Ltd.) as an additive, and further 1 g of CPI-310B (manufactured by San-Apro Ltd.) as a photocuring initiator were added to 10 g of a mixture of bis (3-ethyl-3-oxetanylmethyl) ether and 3,4-epoxycyclohexylmethyl-3',4'-epoxycyclohexanecarboxylate in a mass ratio of 7/3 as a photocurable monomer.

Next, a photocurable composition (5) was obtained in the same manner as in Example 1.

Using the obtained photocurable composition (5), a resin film cured by an LED light source was produced and evaluated according to the evaluation method 1 and the evaluation method 2. The cured resin film had a surface free energy of 34.2 mJ/m$^2$ and a hardness of 0.23 GPa.

In addition, the replica mold A-5 and the replica mold B-5, produced in the same manner as in Example 1, had a convex portion width of 450 nm and a convex portion width of 74 nm, respectively.

Example 6

Preparation of Photocurable Composition (6), Production of Replica Mold, and the Like A photocurable composition (6) was obtained in the same manner as in Example 2, except that the additive (C-2) synthesized in Synthesis Example 2 was used as an additive.

Using the obtained photocurable composition (6), a resin film cured by an LED light source was produced and evaluated according to the evaluation method 1 and the evaluation method 2. The cured resin film had a surface free energy of 28.5 mJ/m$^2$ and a hardness of 0.25 GPa.

In addition, the replica mold A-6 and the replica mold B-6, produced in the same manner as in Example 1, had a convex portion width of 448 nm and a convex portion width of 74 nm, respectively.

Example 7

Preparation of Photocurable Composition (7), Production of Replica Mold, and the Like A photocurable composition (7) was obtained in the same manner as in Example 3, except that X-22-2000 (manufactured by Shin-Etsu Silicone Co., Ltd.), which is an additive of the photocurable composition (3) of Example 3, was changed to FM-DA11 (manufactured by JNC Corporation).

Using the obtained photocurable composition (7), a resin film cured by an LED light source was produced and evaluated according to the evaluation method 1 and the evaluation method 2. The cured resin film had a surface free energy of 25.7 mJ/m$^2$ and a hardness of 0.27 GPa.

In addition, the replica mold A-7 and the replica mold B-7, produced in the same manner as in Example 1, had a convex portion width of 448 nm and a convex portion width of 74 nm, respectively.

Evaluation of Repetitive Usability as Replica Mold with Different Materials

Evaluation Example of Repeated Use Using Replica Mold A-1, and Replica Molds (A-2 to A-7) Produced in Examples 2 to 7

First, a hydrophilized non-alkali glass substrate was prepared by subjecting a non-alkali glass substrate to a hydrophilization treatment by a nitrogen atmospheric pressure plasma treatment such that a water contact angle was 4° or less.

Next, a commercially available nanoimprint material (PAK-01, manufactured by Toyo Gosei Co., Ltd.) as a second photocurable composition was coated on this substrate by a spin coating method.

Using the nanoimprint device described above, the concave-convex surface of the replica mold A-1 was pressed at a gauge pressure of 0.2 MPa against the coated film surface obtained above. While maintaining the pressure, the coat film was cured by irradiation with light at an integrated light amount of 6000 mJ/cm$^2$ from the back surface side of the replica mold. Then, the replica mold A-1 was peeled off to obtain a transfer body A-1 (produced from the replica mold A-1) made of a second photocurable composition having a concave-convex structure formed on a surface thereof.

The repetitive usability of the replica mold A-1 was evaluated by repeatedly carrying out the above-mentioned steps of peeling the replica mold A-1 from the application of the second photocurable composition to the non-alkali glass substrate.

The convex portion width of the replica mold A-1 after 50 times of repeated use was measured by SEM and found to be 449 nm. That is, there was no change in the convex portion width at the time of production (before use as a replica mold).

Evaluation Example of Repeated Use Using Replica Mold B-1 Produced in Example 1 and Replica Molds (B-2 to B-7) Produced in Examples 2 to 6

Each replica mold was repeatedly used 50 times in the same manner as in the replica mold A-1, except that the replica mold used was changed. In a case where the convex portion width of the replica mold after repeated use thereof was measured, there was no change in the convex portion width at the time of production in any of the replica molds.

From the above results, the produced replica mold could be used repeatedly even in a case where the same photocurable composition as the material from which the replica mold was produced was used. That is, it was possible to repeatedly use the replica mold with different materials.

Evaluation of Repetitive Usability as Replica Mold with Same Material

Evaluation Example of Repeated Use Using Replica Mold A-1 Produced in Example 1 and Replica Molds (A-2 to A-7) Produced in Examples 2 to 7

The photocurable composition (1) used in Example 1, as the second photocurable composition, was coated on a PET substrate by the spin coating method.

Using the nanoimprint device described above, the concave-convex surface of the replica mold A-1 was pressed at a gauge pressure of 0.2 MPa against the coated film surface obtained above. While maintaining the pressure, the coat film was cured by irradiation with light at an integrated light amount of 6000 mJ/cm$^2$ from the back surface side of the replica mold. Then, the replica mold A-1 was peeled off to obtain a transfer body A-1 (produced from the replica mold A-1) made of the photocurable composition (1) which is the same material as the second photocurable composition having a concave-convex structure formed on a surface thereof.

The repetitive usability of the replica mold A-1 was evaluated by repeatedly carrying out the above-mentioned steps of peeling the replica mold A-1 from the application of the photocurable composition (1) used in Example 1 as the second photocurable composition.

The convex portion width of the replica mold A-1 after 50 times of repeated use was measured by SEM and found to be 449 nm. That is, there was no change in the convex portion width at the time of production (before use as a replica mold), and there was no problem in appearance.

Each replica mold was repeatedly used 50 times in the same manner as in the replica mold A-1, except that the replica mold used was changed. In a case where the convex portion width of the replica mold after repeated use thereof was measured, there was no change in the convex portion width at the time of production in any of the replica molds, and there was no problem in appearance.

Evaluation Example of Repeated Use Using Replica Mold B-1 Produced in Example 1 and Replica Molds (B-2 to B-7) Produced in Examples 2 to 6

Each replica mold was repeatedly used 50 times in the same manner as in the replica mold A-1, except that the replica mold used was changed. In a case where the convex portion width of the replica mold after repeated use thereof was measured, there was no change in the convex portion width at the time of production in any of the replica molds, and there was no problem in appearance.

From the above results, the produced replica mold could be used repeatedly even in a case where the same photocurable composition as the material from which the replica mold was produced was used. That is, it was possible to repeatedly use the replica mold with the same material.

Comparative Example 1

Preparation of Photocurable Composition (8), and the Like

A solution was prepared in which 0.2 g of IRGACURE 184 (manufactured by BASF Japan Ltd.) as a photocuring initiator was added to 10 g of methyl methacrylate as a photocurable monomer. Next, a photocurable composition (7) was obtained in the same manner as in Example 1.

Using the obtained photocurable composition (8), a resin film cured by an LED light source was produced and evaluated according to the evaluation method 1 and the evaluation method 2. The cured resin film had a surface free energy of 42.7 mJ/m$^2$ and a hardness of 0.35 GPa.

The replica mold A-8 and the replica mold B-8, produced in the same manner as in Example 1, had a convex portion width of 405 nm and a convex portion width of 68 nm, respectively.

In addition, the repetitive usability was evaluated in the same manner as in the section [Evaluation of repetitive usability as replica mold with different materials]. In both the replica mold A-8 and the replica mold B-8, a residue of the second photocurable composition was adhered to the extent that it could be visually recognized after single use. In addition, as a result of SEM observation, the residue of the second photocurable composition was adhered so as to fill the space between the lines.

Further, the repetitive usability was evaluated in the same manner as in the section [Evaluation of repetitive usability as replica mold with same material], but the cured resin layer of the replica mold was melted at the moment in a case where the replica mold A-8 or the replica mold B-8 and the photocurable composition (8) were brought into contact with each other and therefore the next step could not be carried out. That is, the replica mold could not be used repeatedly with the same material.

Comparative Example 2

Preparation of Photocurable Composition (9), and the Like

A solution was prepared in which 0.4 g of IRGACURE 184 (manufactured by BASF Japan Ltd.) as a photocuring initiator was added to 10 g of a mixture of pentaerythritol triacrylate KAYARAD-PET-30 (manufactured by Nippon Kayaku Co., Ltd.) and polyfunctional acrylate polymer BS371 (manufactured by Arakawa Chemical Industries, Ltd.) in a mass ratio of 4/1 as a photocurable monomer, followed by dissolution in 10 g of a mixture of methyl acetate and methyl ethyl ketone (MEK) in a mass ratio of 3/2. Then, filtration was carried out in the same manner as in Example 1 to prepare a photocurable composition (9).

Using the obtained photocurable composition (9), a resin film cured by an LED light source was produced and evaluated according to the evaluation method 1 and the evaluation method 2. The cured resin film had a surface free energy of 37.7 mJ/m$^2$ and a hardness of 0.83 GPa.

In addition, the replica mold A-9 and the replica mold B-9, produced in the same manner as in Example 1, had a convex portion width of 415 nm and a convex portion width of 69 nm, respectively.

Further, the repetitive usability was evaluated in the same manner as in the section [Evaluation of repetitive usability as replica mold with different materials]. In both the replica mold A-9 and the replica mold B-9, no residue adhesion of the second photocurable composition was observed on the surface of the replica mold after single use by SEM observation. However, the line was cracked, and after 10 times of use, a plurality of points of the line were broken.

Further, the repetitive usability was evaluated in the same manner as in the section [Evaluation of repetitive usability as replica mold with same material]. No residue adhesion of the photocurable composition (9) was observed after single use of either the replica mold A-9 or the replica mold B-9, but the line was cracked, and after 10 times of use, a plurality of points of the line were broken.

Comparative Example 3

Preparation of Photocurable Composition (10), and the Like

Among the photocurable compositions (1) described in Example 1, a composition containing no X-22-2000 (manufactured by Shin-Etsu Silicone Co., Ltd.) as an additive was prepared and then filtered in the same manner as in Example 1. As a result, a photocurable composition (10) was prepared.

Using the obtained photocurable composition (10), a resin film cured by an LED light source was produced and evaluated according to the evaluation method 1 and the evaluation method 2. The cured resin film had a surface free energy of 41.3 mJ/m$^2$ and a hardness of 0.27 GPa.

In addition, the replica mold A-10 and the replica mold B-10, produced in the same manner as in Example 1, had a convex portion width of 425 nm and a convex portion width of 71 nm, respectively.

Further, the repetitive usability was evaluated in the same manner as in the section [Evaluation of repetitive usability as replica mold with different materials]. In both the replica mold A-10 and the replica mold B-10, a residue of the second photocurable composition was adhered to the extent that it could be visually recognized after three times of use. In addition, as a result of SEM observation, the residue of the second photocurable composition was adhered so as to fill the space between the lines.

Further, the repetitive usability was evaluated in the same manner as in the section [Evaluation of repetitive usability as replica mold with same material]. The replica mold A-10 or the replica mold B-10 and the photocurable composition (10) were brought into contact with each other and cured by UV irradiation. Then, an attempt was made to peel off the replica mold and the photocurable composition from each other, but the replica mold and the photocurable composition adhered strongly and therefore could not be peeled off from each other. That is, the replica mold could not be used repeatedly with the same material.

Table 1 and Table 2 summarize the composition information (formulation components), surface free energy and hardness of the photocurable compositions, and the evaluation results of the repetitive usability as a replica mold.

TABLE 1

| Example | Photocurable composition | Components of photocurable composition | | | | | Physical property value of resin after photocuring | |
|---|---|---|---|---|---|---|---|---|
| | | Photocurable Monomer (A) | Binder resin (B) | Additive (C) | Photocuring initiator (D) | Other additives | Surface free energy mJ/m$^2$ | Hardness GPa |
| Example 1 | (1) | Mixture of bis(3-ethyl-3-oxetanylmethyl)ether and 3,4-epoxycyclohexylmethyl-3',4'-epoxycyclohexanecarboxylate in mass ratio of 7/3 | None | X-22-2000 | CPI-310B | None | 26.2 | 0.28 |

TABLE 1-continued

| Example | Photo-curable com-position | Photocurable Monomer (A) | Binder resin (B) | Additive (C) | Photocuring initiator (D) | Other additives | Surface free energy mJ/m² | Hardness GPa |
|---|---|---|---|---|---|---|---|---|
| Example 2 | (2) | Mixture of bis(3-ethyl-3-oxetanylmethyl)ether and 3,4-epoxycyclohexylmethyl-3',4'-epoxycyclohexanecarboxylate in mass ratio of 7/3 | None | Polymer (C-1) | CPI-310B | None | 32.0 | 0.22 |
| Example 3 | (3) | Mixture of bis(3-ethyl-3-oxetanylmethyl)ether and 3,4-epoxycyclohexylmethyl-3',4'-epoxycyclohexanecarboxylate in mass ratio of 7/3 | None | X-22-2000/ Polymer (C-1) | CPI-310B | None | 36.8 | 0.25 |
| Example 4 | (4) | Limonene dioxide | None | BY16-876/ Polymer (C-1) | CPI-310B | ANTHRA-CURE UVS-1331 (sensitizer) | 33.2 | 0.24 |
| Example 5 | (5) | Mixture of bis(3-ethyl-3-oxetanylmethyl)ether and 3,4-epoxycyclohexylmethyl-3',4'-epoxycyclohexanecarboxylate in mass ratio of 7/3 | Binder resin (B-1) | X-22-2000 | CPI-310B | None | 34.2 | 0.23 |
| Example 6 | (6) | Mixture of bis(3-ethyl-3-oxetanylmethyl)ether and 3,4-epoxycyclohexylmethyl-3',4'-epoxycyclohexanecarboxylate in mass ratio of 7/3 | None | Polymer (C-2) | CPI-310B | None | 28.5 | 0.25 |
| Example 7 | (7) | Mixture of bis(3-ethyl-3-oxetanylmethyl)ether and 3,4-epoxycyclohexylmethyl-3',4'-epoxycyclohexanecarboxylate in mass ratio of 7/3 | None | FM-DA11/ Polymer (C-1) | CPI-310B | None | 25.7 | 0.27 |
| Comparative Example 1 | (8) | Methyl methacrylate | None | None | IRGACURE 184 | None | 42.7 | 0.35 |
| Comparative Example 2 | (9) | Mixture of pentaerythritol triacrylate/acrylate polymer in mass ratio of 4/1 | None | None | IRGACURE 184 | Methyl acetate and MEK | 37.7 | 0.83 |
| Comparative Example 3 | (10) | Mixture of bis(3-ethyl-3-oxetanylmethyl)ether and 3,4-epoxycyclohexylmethyl-3',4'-epoxycyclohexanecarboxylate in mass ratio of 7/3 | None | None | CPI-310B | None | 41.3 | 0.27 |

TABLE 2

| | | Evaluation after 50 times of repeated use | | | |
|---|---|---|---|---|---|
| | | Replica mold A | | Replica mold B | |
| Example | Photocurable composition | Line width (nm) < > shows dimension at time of producing replica mold. Upper: different materials Lower: same material | Judgement | Line width (nm) < > shows dimension at time of producing replica mold. Upper: different materials Lower: same material | Judgement |
| Example 1 | (1) | 449<br><449><br>449<br><449> | Y<br><br>Y | 74<br><74><br>74<br><74> | Y<br><br>Y |
| Example 2 | (2) | 449<br><449><br>449<br><449> | Y<br><br>Y | 73<br><73><br>73<br><73> | Y<br><br>Y |
| Example 3 | (3) | 448<br><448><br>448<br><448> | Y<br><br>Y | 75<br><75><br>75<br><75> | Y<br><br>Y |
| Example 4 | (4) | 448<br><448><br>448<br><448> | Y<br><br>Y | 74<br><74><br>74<br><74> | Y<br><br>Y |

TABLE 2-continued

| | | Evaluation after 50 times of repeated use | | | |
|---|---|---|---|---|---|
| | | Replica mold A | | Replica mold B | |
| Example | Photocurable composition | Line width (nm) < > shows dimension at time of producing replica mold. Upper: different materials Lower: same material | Judgement | Line width (nm) < > shows dimension at time of producing replica mold. Upper: different materials Lower: same material | Judgement |
| Example 5 | (5) | 450 <450> | Y | 74 <74> | Y |
| | | 450 <450> | Y | 74 <74> | Y |
| Example 6 | (6) | 448 <448> | Y | 74 <74> | Y |
| | | 448 <448> | Y | 74 <74> | Y |
| Example 7 | (7) | 448 <448> | Y | 74 <74> | Y |
| | | 448 <448> | Y | 74 <74> | Y |
| Comparative Example 1 | (8) | Not measurable (Resin adhered after single use) | N | Not measurable (Resin adhered after single use) | N |
| | | Not measurable (Dissolved after single use) | N | Not measurable (Dissolved after single use) | N |
| Comparative Example 2 | (9) | Line broken after 10 times of use (Intact portion: 415 nm/<415 nm>) | N | Line broken after 10 times of use (Intact portion: 69 nm/<69 nm>) | N |
| | | Line broken after 10 times of use (Intact portion: 415 nm/<415 nm>) | N | Line broken after 10 times of use (Intact portion: 415 nm/<415 nm>) | N |
| Comparative Example 3 | (10) | Not measurable (Resin adhered after 3 times of use) | N | Not measurable (Resin adhered after 3 times of use) | N |
| | | Not measurable (Adhered closely after single use) | N | Not measurable (Adhered closely after single use) | N |

In the "Determination" column of Table 2, as a result of SEM observation after use of the replica, a case having no change in the shape of the concave-convex structure of the replica molds A and B after 50 times of use and having no change in the line width from that at the time of producing the replica mold was marked with Y (good), and a case having resin adhesion (not measurable) or breakage was marked with N (poor).

From the above results, the repetitive usability of the replica mold produced from the photocurable composition of Example 1 was satisfactory. That is, no residue adhesion of the second photocurable composition to the surface was observed after at least 50 times of use, and deterioration of the replica mold such as line breakage was suppressed and therefore the replica mold could be used repeatedly.

This application claims priority based on Japanese Patent Application No. 2019-129863 filed on Jul. 12, 2019, the disclosure of which is incorporated herein in its entirety.

The invention claimed is:

1. A photocurable composition used for forming a resin layer of a concave-convex structure including a substrate and a resin layer provided on the substrate and having fine concavities and convexities formed on a surface thereof,
wherein the photocurable composition has a surface free energy of 15 mJ/m$^2$ to 40 mJ/m$^2$ as measured by the following evaluation method 1, and a hardness of 0.05 GPa to 0.5 GPa as measured by the following evaluation method 2,
(evaluation method 1)
in which first, the photocurable composition is coated on a substrate to form a photocurable film, which is then irradiated with ultraviolet rays to obtain a cured film; next, contact angles of water, diiodomethane, and 1-bromonaphthalene with respect to the cured film are measured using a contact angle meter; and then, the surface free energy is calculated from a Kitazaki-Hata theory, and
(evaluation method 2)
in which first, a cured film is obtained in the same manner as in the evaluation method 1; and
next, using a nanoindenter, a Berkovich indenter is pressed against the cured film, and the hardness is calculated from a value of the detected stress.

2. The photocurable composition according to claim 1, wherein the photocurable composition comprises (a) photocurable monomer or photocurable monomer and binder resin, and (b) additive having a photoreactive functional group, and
a content of (b) additive having a photoreactive functional group is 0.001% by mass to 10% by mass with respect to a total amount of (a) photocurable monomer or photocurable monomer and binder resin, and (b) additive having a photoreactive functional group.

3. The photocurable composition according to claim 2, wherein (b) additive having a photoreactive functional group includes at least one selected from the group consisting of an additive represented by General Formula (1) and an additive containing a structure represented by General Formula (2):

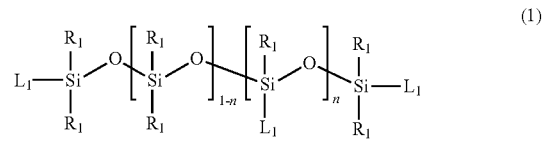

in General Formula (1),
R$_1$'s are the same or different from one another and represent any atom or group selected from the group consisting of a hydrogen atom, a fluorine atom, a halogen atom, a hydrocarbon group having 1 to 20 carbon atoms, an aryl group having 6 to 20 carbon atoms, an aralkyl group having 6 to 20 carbon atoms, a polyether group having 1 to 20 carbon atoms, and a fluorocarbon group having 1 to 20 carbon atoms, at least one of $L_1$'s contains a photoreactive functional group selected from the group consisting of an epoxy group, a hydroxyl group, an amino group, a vinyl ether group, a lactone group, a propenyl ether group, an olefin group, an oxetanyl group, a vinyl group, an acrylate group, a carbinol group, and a carboxy group, and in a case where $L_1$ is not a photoreactive functional group, $L_1$'s are the same or different from one another and represent an atom or group selected from the above-mentioned $R_1$, and n and 1-n represent a ratio of each unit,

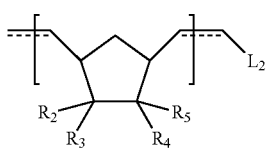

(2)

in General Formula (2), $L_2$ is a photoreactive functional group selected from the group consisting of an epoxy group, an amino group, a vinyl ether group, a lactone group, a propenyl ether group, an alcohol group, an olefin group, an oxetanyl group, a vinyl group, an acrylate group, a carbinol group, and a carboxy group, at least one of $R_2$ to $R_5$ is a fluorine-containing group selected from the group consisting of fluorine, a fluorine-containing alkyl group having 1 to 10 carbon atoms, a fluorine-containing alkoxy group having 1 to 10 carbon atoms, and a fluorine-containing alkoxyalkyl group having 2 to 10 carbon atoms, in a case where $R_2$ to $R_5$ are not fluorine-containing groups, $R_2$ to $R_5$ are organic groups selected from the group consisting of hydrogen, an alkyl group having 1 to 10 carbon atoms, an alkoxy group having 1 to 10 carbon atoms, and an alkoxyalkyl group having 2 to 10 carbon atoms, $R_2$ to $R_5$ may be the same or different from one another, and $R_2$ to $R_5$ may be bonded to each other to form a ring structure, and a dotted line indicates that a bond of the portion thereof may be a carbon-carbon single bond or a carbon-carbon double bond.

4. The photocurable composition according to claim 1, wherein the photocurable composition comprises a photocuring initiator.

5. The photocurable composition according to claim 2, wherein the photocurable monomer includes a cationically polymerizable compound having a ring-opening polymerizable group.

6. A method for producing a concave-convex structure including a substrate and a resin layer provided on the substrate and having fine concavities and convexities formed on a surface thereof, using the photocurable composition according to claim 1, the method comprising:
a pressing step of pressing a mold having a fine concave-convex pattern against a photocurable layer provided with the photocurable composition on a substrate to form a fine concave-convex pattern corresponding to the fine concave-convex pattern on a surface of the resin layer.

7. The method for producing a concave-convex structure according to claim 6, further comprising:
a light irradiation step of curing the photocurable layer to form a cured layer by irradiating the photocurable layer with light while the mold is pressed, after the pressing step; and
a peeling step of peeling the mold from the cured layer.

8. A method for forming a fine concave-convex pattern by repeatedly using a substrate which is provided with a resin layer having fine concavities and convexities formed on a surface thereof and formed of the photocurable composition according to claim 1.

9. A concave-convex structure comprising:
a substrate; and
a resin layer provided on the substrate, having fine concavities and convexities formed on a surface thereof, and formed of the photocurable composition according to claim 1.

10. The photocurable composition according to claim 3, wherein the photocurable monomer includes a cationically polymerizable compound having a ring-opening polymerizable group.

11. A method for producing a concave-convex structure including a substrate and a resin layer provided on the substrate and having fine concavities and convexities formed on a surface thereof, using the photocurable composition according to claim 2, the method comprising:
a pressing step of pressing a mold having a fine concave-convex pattern against a photocurable layer provided with the photocurable composition on a substrate to form a fine concave-convex pattern corresponding to the fine concave-convex pattern on a surface of the resin layer.

12. A method for producing a concave-convex structure including a substrate and a resin layer provided on the substrate and having fine concavities and convexities formed on a surface thereof, using the photocurable composition according to claim 3, the method comprising:
a pressing step of pressing a mold having a fine concave-convex pattern against a photocurable layer provided with the photocurable composition on a substrate to form a fine concave-convex pattern corresponding to the fine concave-convex pattern on a surface of the resin layer.

* * * * *